United States Patent
Hwang et al.

(10) Patent No.: US 9,929,358 B2
(45) Date of Patent: Mar. 27, 2018

(54) ORGANIC LIGHT-EMITTING DEVICES

(71) Applicant: SAMSUNG DISPLAY CO., LTD., Yongin, Gyeonggi-Do (KR)

(72) Inventors: Jin-Soo Hwang, Yongin (KR); Myeong-Suk Kim, Yongin (KR); Soung-Wook Kim, Yongin (KR); Jae-Hong Kim, Yongin (KR); Sung-Ho Jin, Yongin (KR)

(73) Assignees: SAMSUNG DISPLAY CO., LTD., Yongin, Gyeonggi-Do (KR); PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 798 days.

(21) Appl. No.: 14/338,926

(22) Filed: Jul. 23, 2014

(65) Prior Publication Data
US 2015/0207084 A1    Jul. 23, 2015

(30) Foreign Application Priority Data
Jan. 22, 2014   (KR) .................... 10-2014-0007939

(51) Int. Cl.
*H01L 51/00* (2006.01)
*H01L 51/50* (2006.01)

(52) U.S. Cl.
CPC ...... *H01L 51/0085* (2013.01); *H01L 51/0061* (2013.01); *H01L 51/0072* (2013.01); *H01L 51/5016* (2013.01)

(58) Field of Classification Search
CPC ............. H01L 51/0072; H01L 51/0085; H01L 51/5016
See application file for complete search history.

(56) References Cited

U.S. PATENT DOCUMENTS

| | | | | |
|---|---|---|---|---|
| 7,431,997 B2* | 10/2008 | Hwang | ................ | C07D 209/88 313/504 |
| 7,838,131 B2* | 11/2010 | Ise | .................... | C09K 11/06 313/504 |
| 8,188,315 B2* | 5/2012 | Hwang | ................ | C09K 11/06 428/690 |
| 8,974,922 B2* | 3/2015 | Hwang | ................ | C09K 11/06 257/40 |

(Continued)

FOREIGN PATENT DOCUMENTS

KR   10-2010-0062581 A    6/2010
KR   10-2010-0110958 A    10/2010
(Continued)

OTHER PUBLICATIONS

T. Giridhar et al., 15 Organic Electronics, 1687-1694 (May 9, 2014).*
CAS Index of Carbazole (1984).*

*Primary Examiner* — Alexander R Pagano
(74) *Attorney, Agent, or Firm* — Lee & Morse, P.C.

(57) ABSTRACT

An organic light-emitting device including a first electrode; a second electrode opposite to the first electrode; an emission layer between the first electrode and the second electrode; and a hole transport region between the first electrode and the emission layer, wherein the emission layer includes at least one organometallic compound represented by Formula 1; and wherein the hole transport region includes at least one selected carbazole-based compound represented by Formula 2:

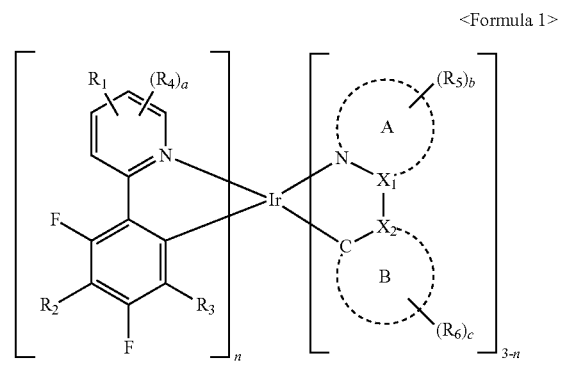

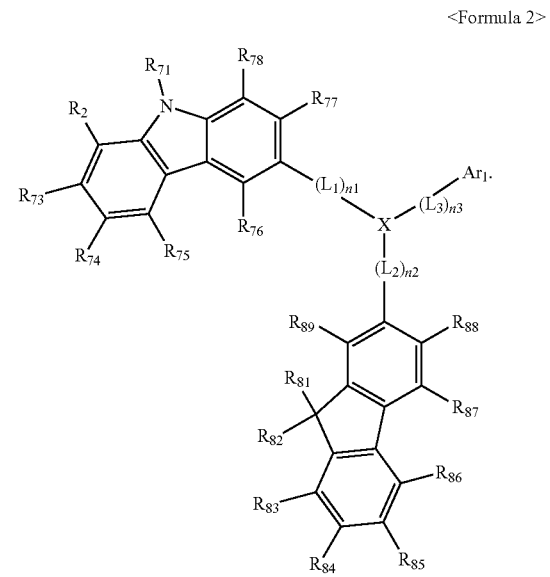

14 Claims, 1 Drawing Sheet

(56) References Cited

U.S. PATENT DOCUMENTS

| | | | | |
|---|---|---|---|---|
| 9,478,754 B2* | 10/2016 | Hwang | ................... | C09K 11/06 |
| 2002/0024293 A1* | 2/2002 | Igarashi | .............. | C07F 15/0033 |
| | | | | 313/483 |
| 2005/0260452 A1* | 11/2005 | Ise | ......................... | C09K 11/06 |
| | | | | 428/690 |
| 2006/0020136 A1* | 1/2006 | Hwang | ................ | C07D 209/88 |
| | | | | 548/440 |
| 2012/0097924 A1 | 4/2012 | Kim et al. | | |
| 2013/0032788 A1 | 2/2013 | Lee et al. | | |
| 2014/0209873 A1 | 7/2014 | Kim et al. | | |
| 2017/0005273 A1* | 1/2017 | Hwang | ................... | C09K 11/06 |

FOREIGN PATENT DOCUMENTS

| | | |
|---|---|---|
| KR | 10-2012-0043623 A | 5/2012 |
| KR | 10-2013-0016032 A | 2/2013 |
| KR | 10-2014-0097937 A | 8/2014 |

* cited by examiner

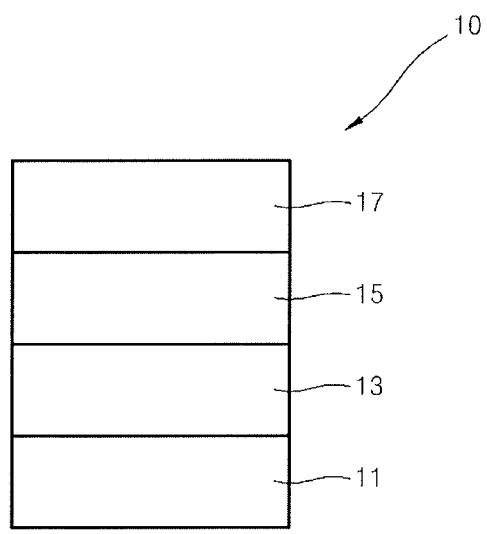

ORGANIC LIGHT-EMITTING DEVICES

CROSS-REFERENCE TO RELATED APPLICATION

Korean Patent Application No. 10-2014-0007959, filed on Jan. 22, 2014, in the Korean Intellectual Property Office, and entitled: "Organic Light-Emitting Devices," is incorporated by reference herein in its entirety.

BACKGROUND

1. Field

Embodiments relate to an organic light-emitting device.

2. Description of the Related Art

Organic light-emitting diodes (OLEDs), which are self-emitting diodes, may have advantages such as wide viewing angles, excellent contrast, quick response, high brightness, and excellent driving voltage characteristics, and may provide multicolored images.

An OLED may have a structure including a substrate, and an anode, a hole transport layer (HTL), an emission layer (EML), an electron transport layer (ETL), and a cathode which are sequentially stacked on the substrate. The HTL, the EML, and the ETL may be organic thin films formed of organic compounds.

An operating principle of an OLED having the above-described structure may be as follows:

When a voltage is applied between the anode and the cathode, holes injected from the anode may move to the EML via the HTL, and electrons injected from the cathode may move to the EML via the ETL. The holes and electrons (carriers) may recombine in the EML to generate excitons. When the excitons drop from an excited state to a ground state, light may be emitted.

SUMMARY

Embodiments are directed to an organic light-emitting device

According to one or more embodiments, an organic light-emitting device includes a first electrode; a second electrode disposed opposite to the first electrode; an emission layer (EML) disposed between the first electrode and the second electrode; and a hole transport region between the first electrode and the EML, wherein the EML includes at least one organometallic compounds represented by Formula 1 and the hole transport region includes at least one carbazole-based compounds represented by Formula 2:

<Formula 1>

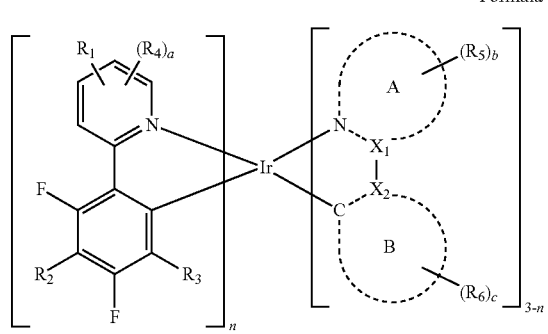

<Formula 2>

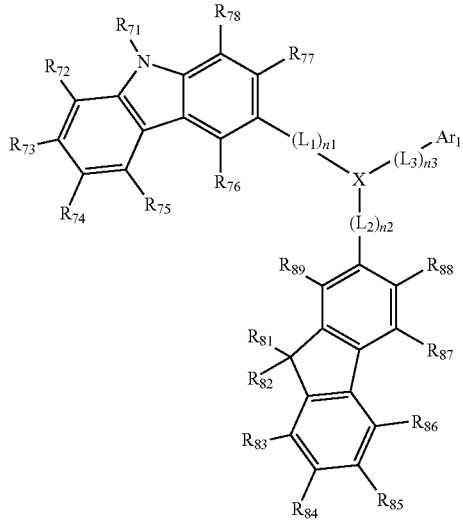

In Formulae 1 and 2, $R_1$ is selected from a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —$N(Q_1)(Q_2)$, —$C(=O)(Q_3)$, and —$Si(Q_4)(Q_5)(Q_6)$ (wherein, $Q_1$ to $Q_6$ are each independently a hydrogen, a substituted or unsubstituted $C_1$-$C_{60}$ alkyl group, a substituted or unsubstituted $C_6$-$C_{30}$ aryl group, or a substituted or unsubstituted $C_2$-$C_{30}$ heteroaryl group);

$R_2$ to $R_6$ are each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —$N(Q_1)(Q_2)$, —$C(=O)(Q_3)$, and —$Si(Q_4)(Q_5)(Q_6)$ (wherein, $Q_1$ to $Q_6$ are each independently selected from a hydrogen, a substituted or unsubstituted $C_1$-$C_{60}$ alkyl group, a substituted or unsubstituted $C_6$-$C_{30}$ aryl group, or a substituted or unsubstituted $C_2$-$C_{30}$ heteroaryl group);

a is an integer selected from 1 to 3 and when a is 2 or greater, two or more $R_4$s may be the same or different;

b and c are each independently an integer selected from 1 to 6 and when b is 2 or greater, two or more $R_5$s may be the same or different, and when c is 2 or greater, two or more $R_6$s may be the same or different;

ring A is selected from or forms a pyrrole, an imidazole, a pyrazole, a triazole, a thiazole, an oxazole, an isothiazole, and isoxazole, a benzothiazole, a benzimidazole, a benzoxazole, a pyridine, a pyrazine, a pyrimidine, a pyridazine, an isoindole, an indole, an indazole, a purine, an isoquinoline, a phthalazine, a naphthyridine, a quinoxaline, a quinazoline, a cinnoline, a phenanthridine, an acridine, a phenanthroline, a phenazine, and a phenoxazine;

ring B is selected from or forms a benzene, a pentalene, an indene, a naphthalene, an azulene, a heptalene, an indacene, an acenaphthylene, a fluorene, a spiro-fluorene, a phenalene, a phenanthrene, an anthracene, a fluoranthene, a triphenylene, a pyrene, a chrysene, a pyrrole, an imidazole, a pyrazole, a triazole, an isothiazole, an isoxazole, a pyridine, a pyrazine, a pyrimidine, a pyridazine, an isoindole, an indole, an indazole, a purine, an isoquinoline, a quinoline, a phthalazine, a naphthyridine, a quinoxaline, a quinazoline, a cinnoline, a phenanthridine, an acridine, a phenanthroline, a phenazine, and a phenoxazine;

$X_1$ and $X_2$ are each independently N or C;

n is 1 or 2;

X is a boron atom (B), a nitrogen atom (N), or a phosphorus atom (P);

$L_1$ to $L_3$ are each independently selected from i) a $C_6$-$C_{60}$ arylene group; and ii) a $C_6$-$C_{60}$ group substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group;

n1 to n3 are each independently an integer selected from 0 to 5;

$R_{71}$ to $R_{78}$ and $R_{81}$ to $R_{89}$ are each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group; and $Ar_1$ is selected from i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group and a substituted or unsubstituted $C_2$-$C_{60}$ heteroaryl group.

In another embodiment, provided is an organic light-emitting device including a first electrode; a second electrode disposed opposite to the first electrode; an EML disposed between the first electrode and the second electrode; and a hole transport region between the first electrode and the EML, wherein the EML includes at least one organometallic compound represented by Formulae 1B and 1C and the hole transport region includes at least one carbazole-based compound represented by Formula 2A:

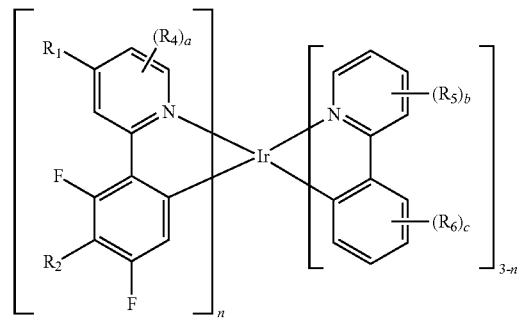

<Formula 1B>

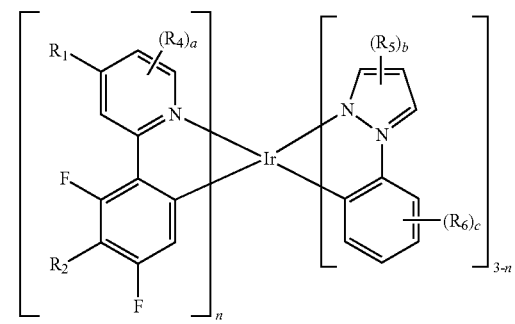

<Formula 1C>

<Formula 2A>

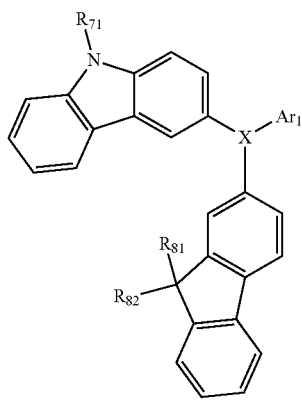

In Formulae 1B, 1C, and 2A, $R_1$ is selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, a tert-decanyl, and —N($Q_1$)($Q_2$), $R_2$ is selected from a deuterium, —F, —Cl, a cyano group, a nitro group; a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F; a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one F; and —C(=O)($Q_3$), wherein $Q_1$ to $Q_3$ are each independently a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F; a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group and a carbazolyl group, each substituted with F and at least one $C_1$-$C_{20}$ alkyl group substituted with at least one —F, $R_4$ to $R_6$ is a hydrogen, a, b, and c are each independently an integer selected from 1 to 3 and when a is 2 or greater, two or more $R_4$s may be the same or different, when b is 2 or greater, two or more $R_5$s may be the same or different, and when c is 2 or greater, two or more $R_6$s may be the same or different, n is 1 or 2;

X is a B atom, an N atom, or a P atom;

$R_{71}$, $R_{81}$, and $R_{82}$ are each independently selected from a hydrogen, a deuterium, —F, a cyano group, a nitro group, a methyl group, an ethyl group, a tert-butyl group, a phenyl group, and a naphthyl group;

$Ar_1$ is selected from i) a phenyl group, a naphthyl group, an anthryl group, a fluorenyl group, a pyridyl group, a pyrimidyl group, a pyrazinyl group, a triazinyl group, and a carbazole group; and ii) a phenyl group, a naphthyl group, an anthryl group, a fluorenyl group, a pyridyl group, a pyrimidyl group, a pyrazinyl group, a triazinyl group, and a carbazole group, each substituted with at least one of a hydrogen, a deuterium, —F, a cyano group, a nitro group, a methyl group, an ethyl group, a tert-butyl group, a phenyl group, and a naphthyl group.

BRIEF DESCRIPTION OF THE DRAWING

Features will be apparent to those of skill in the art by describing in detail exemplary embodiments with reference to the attached drawings in which:

The FIGURE illustrates a cross-sectional view schematically showing a structure of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURES, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

As used herein, the expression "(organic layer) includes at least one organometallic compound" may be construed as "(organic layer) may include one organometallic compound belonging to a range of Formula 1 or two or more different organic compounds belonging to the range of Formula 1".

For example, the organic layer may include an organometallic compound and may only include Compound 1. In this regard, Compound 1 may exist in an emission layer (EML) of an organic light-emitting device. In another embodiment, the organic layer is the organometallic compound and may include both Compound 1 and Compound 2. In this regard, Compound 1 and Compound 2 may exist in the same layer (for example, in the EML) or in different layers (for example, in a first EML and a second EML, respectively).

The organic layer may further include at least one layer selected from a hole injection layer (HTL), a hole transport layer (HTL), a functional layer having both hole injection and hole transport capabilities (hereinafter, an "H-functional layer"), a buffer layer, and an electron blocking layer (EBL) between a first electrode and the EML, and at least one layer selected from a hole blocking layer (HBL), an ETL, and an EIL between the EML and a second electrode.

As used herein, the expression, the "organic layer" is a term that refers to a single layer and/or a multi-layer disposed between the first electrode and the second electrode in the organic light-emitting device.

The organic layer includes the EML, wherein at least one organometallic compound is included in the EML.

The organometallic compound included in the EML may act as a phosphorescent dopant, and the EML may further include a host. The types of the host will be described below.

As described above, the organic light-emitting device including the organometallic compound may emit green light, for example, green phosphorescent light.

The FIGURE illustrates a cross-sectional view schematically showing a structure of an organic light-emitting device 10 according to an embodiment. Hereinafter, a structure and a manufacturing method of an organic light-emitting device according to an embodiment will be described as follows:

The organic light-emitting device 10 may include a substrate 11, a first electrode 13, an organic layer 15, and a second electrode 17.

The substrate 11, which may be any substrate that is used in general organic light-emitting devices, may be a glass substrate or a apparent plastic substrate with excellent mechanical strength, thermal stability, transparency, surface smoothness, ease of handling, and water resistance.

The first electrode 13 may be formed by, e.g., depositing or sputtering a material for a first electrode on the substrate 11. When the first electrode 13 is an anode, the material for the first electrode 13 may be selected from materials with a high work function to enable ease of hole injection. The first electrode 13 may be a reflective electrode or a transmission electrode. The material for the first electrode 13 may be a transparent material with high conductivity, and examples of such a material may include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may have a single-layer structure or a multi-layer structure including at least two layers. For example, the first electrode 13 may have a three-layered structure of ITO/Ag/ITO, but is not limited thereto.

The organic layer 15 may be on the first electrode 13.

The organic layer 15 may include an EML between the first electrode 13 and the second electrode 17.

The organic layer 15 may further include a hole transport region between the first electrode 13 and the EML. The hole transport region may include at least one layer selected from an HIL, an HTL, an H-functional layer, a buffer layer, and an EBL.

The organic layer 15 may further include an electron transport region between the EML and the second electrode 17. The electron transport region may include at least one layer selected from at HBL, an ETL, and an EIL.

The HIL may be formed on the first electrode 13 by using various methods, such as vacuum deposition, spin coating, casting, and Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

A thickness of the HIL may be about 100 Å to about 10,000 Å, e.g., about 100 Å to about 1,000 Å. When the thickness of the HIL is within the range described above, the HIL may have satisfactory hole injection characteristics without a substantial increase in a driving voltage.

Then, the HTL may be formed on the HIL by using vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to a compound that is used to form the HTL.

A thickness of the HTL may be in a range of about 50 Å to about 2,000 Å, e.g., about 100 Å to about 1,500 Å. When the thickness of the HTL is within the range described above, the HTL may have satisfactory hole transport characteristics without a substantial increase in a driving voltage.

A thickness of the H-functional layer may be in a range of about 500 Å to about 10,000 Å, e.g., about 100 Å to about 1,000 Å. When the thickness of the H-functional layer is within the range described above, the H-functional layer may have satisfactory hole injection and transport characteristics without a substantial increase in a driving voltage.

The hole transport region may include at least one carbazole-containing or carbazole-based compound represented by Formula 2:

<Formula 2>

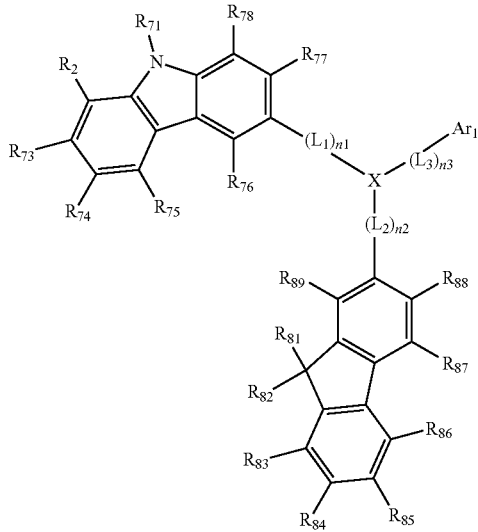

In Formula 2, X may be a boron atom, a nitrogen atom, or a phosphorus atom.

For example, in Formula 2, X may be an N atom, but the X is not limited thereto.

In Formula 2, $L_1$ to $L_3$ may be each independently selected from:

i) a $C_6$-$C_{60}$ arylene group; and ii) a $C_6$-$C_{60}$ arylene group substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 2, $L_1$ to $L_3$ may be each independently selected from i) a phenylene group, a naphthylenyl group, and an anthracenylene group; and ii) a phenylene group, a naphthylenyl group, and an anthracenylene group, each substituted with at least one of a deuterium, a halogen atom, a hydroxyl group, a cyano group, a nitro group, and a substituted or unsubstituted $C_1$-$C_{60}$ alkyl group.

In Formula 2, n1 represents the number of $L_1$s, which may be an integer of 0 to 5, and when n1 is an integer greater than 2, the n1 number of $L_1$s may be the same or different.

In Formula 2, n2 represents the number of $L_2$s and may be an integer of 0 to 5, and when n2 is greater than 2, the n2 number of $L_2$s may be the same or different.

In Formula 2, n3 represents the number of $L_3$s and may be an integer of 0 to 5, and when n3 is an integer greater than 2, the n3 number of $L_3$s may be the same or different.

For example, in Formula 2, n1 to n3 may be each independently an integer of 0 or 1, but n1 to n3 are not limited thereto.

In Formula 2, $R_{71}$ to $R_{78}$ and $R_{81}$ to $R_{89}$ may be each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 2, $R_{71}$ to $R_{78}$ and $R_{81}$ to $R_{89}$ may be each independently selected from:

i) a hydrogen, a deuterium, a halogen atom, a cyano group, a nitro group, a $C_1$-$C_{60}$ alkyl group, and a $C_6$-$C_{60}$ aryl group;

ii) a $C_1$-$C_{60}$ alkyl group substituted with at least one of a hydrogen, a deuterium, a halogen atom, a cyano group, and a nitro group; and iii) a $C_6$-$C_{60}$ aryl group substituted with at least one of a hydrogen, a deuterium, a halogen atom, a cyano group, a nitro group, and a $C_1$-$C_{60}$ alkyl group, but they are not limited thereto.

For example, in Formula 2, $R_{71}$ to $R_{78}$ and $R_{81}$ to $R_{89}$ may be each independently selected from a hydrogen, a deuterium, —F, a cyano group, a nitro group, a methyl group, an ethyl group, a tert-butyl group, a phenyl group, and a naphthyl group, but they are not limited thereto.

In Formula 2, $Ar_1$ may be selected from:

i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 2, $Ar_1$ may be selected from:

i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group, each substituted with at least one of a deuterium, a halogen atom, a cyano group, a nitro group, a $C_1$-$C_{60}$ alkyl group, and a $C_6$-$C_{60}$ aryl group, but they are not limited thereto.

For example, in Formula 2, $Ar_1$ may be selected from:

i) a phenyl group, a naphthyl group, an anthryl group, a fluorenyl group, a pyridyl group, a pyrimidyl group, a pyrazinyl group, a triazinyl group, and a carbazole group; and ii) a phenyl group, a naphthyl group, an anthryl group, a fluorenyl group, a pyridyl group, a pyrimidyl group, a pyrazinyl group, a triazinyl group, and a carbazole group, each substituted with at least one of a hydrogen, a deuterium, —F, a cyano group, a nitro group, a methyl group, an ethyl group, a tert-butyl group, a phenyl group, and a naphthyl group, but it is not limited thereto.

In an implementation, the carbazole-based compound represented by Formula 2 may be represented by Formula 2A, but it is not limited thereto:

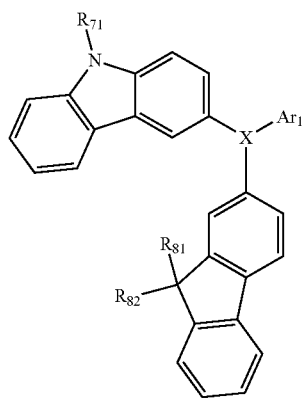

<Formula 2A>

In Formula 2A,

X may be a B atom, an N atom, or a P atom;

$R_{71}$, $R_{81}$, and $R_{82}$ may be each independently selected from a hydrogen, a deuterium, —F, a cyano group, a nitro group, a methyl group, an ethyl group, a tert-butyl group, a phenyl group, and a naphthyl group;

$Ar_1$ may be selected from:

i) a phenyl group, a naphthyl group, an anthryl group, a fluorenyl group, a pyridyl group, a pyrimidyl group, a pyrazinyl group, a triazinyl group, and a carbazole group; and ii) a phenyl group, a naphthyl group, an anthryl group, a fluorenyl group, a pyridyl group, a pyrimidyl group, a pyrazinyl group, a triazinyl group, and a carbazole group, each substituted with at least one of a hydrogen, a deuterium, —F, a cyano group, a nitro group, a methyl group, an ethyl group, a tert-butyl group, a phenyl group, and a naphthyl group.

For example, the carbazole-based compound represented by Formula 2 may include one of Compounds 21 to 42, but it is not limited thereto:

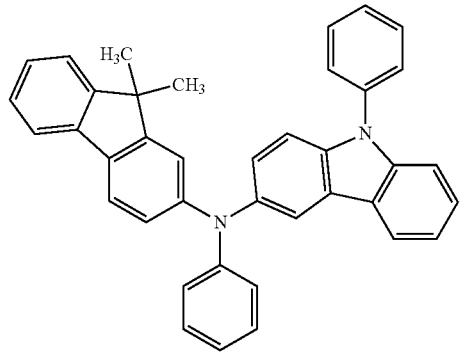

21

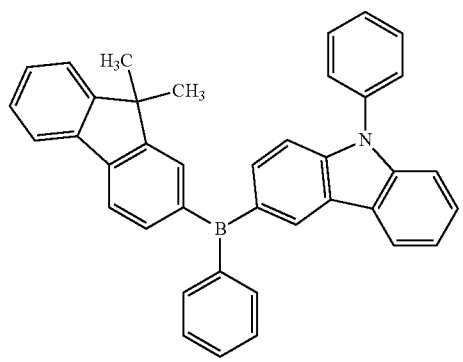

22

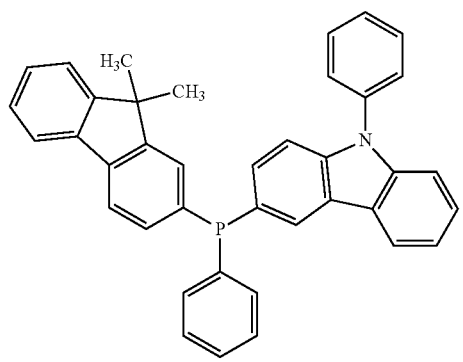

23

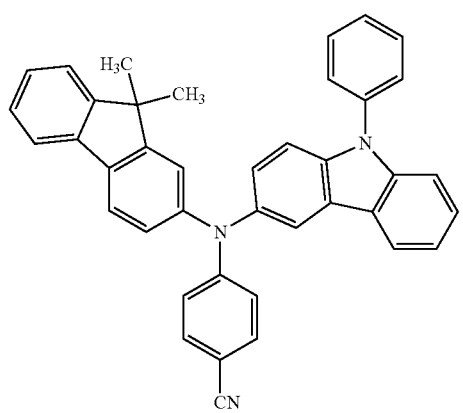

24

25
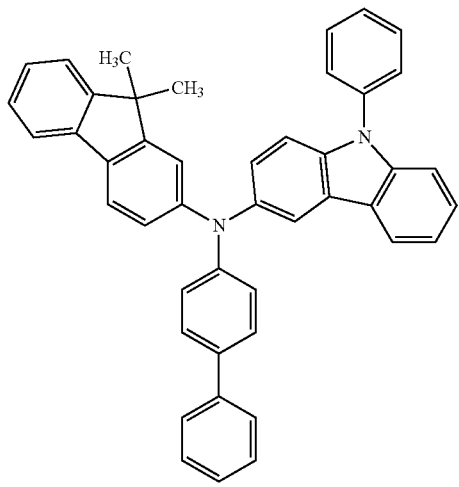
26
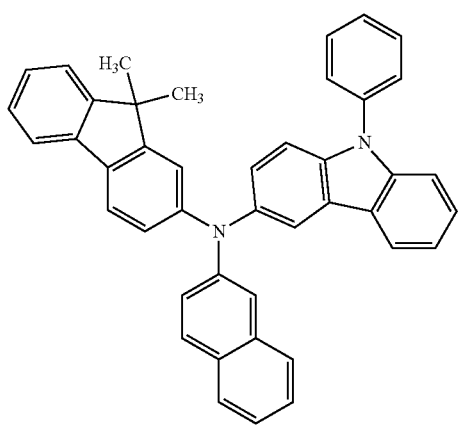
27
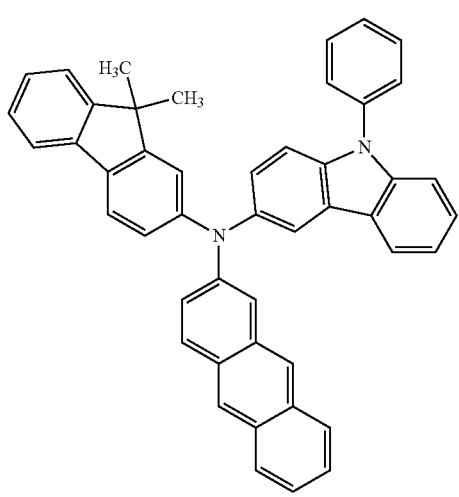
28
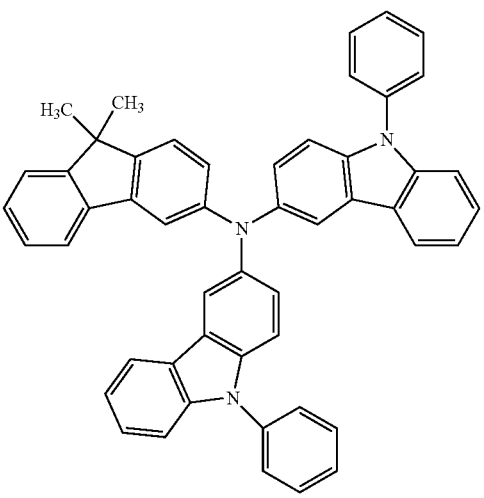
29
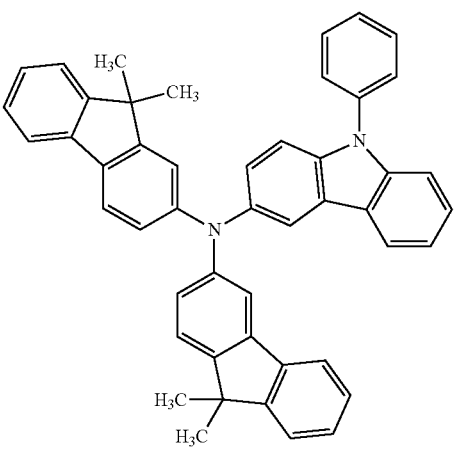
30
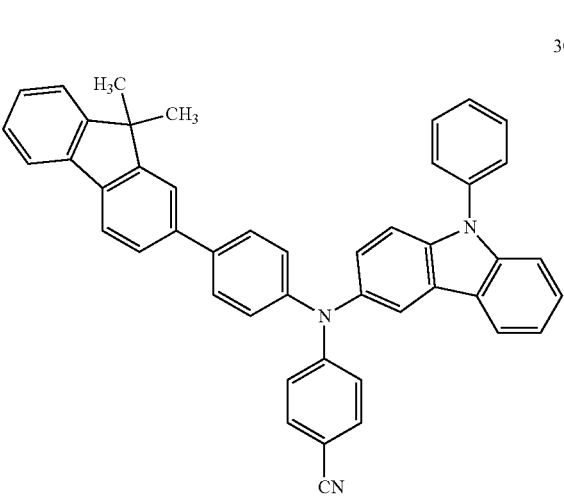

31
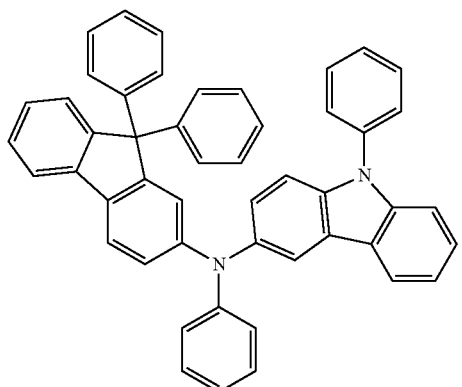
32
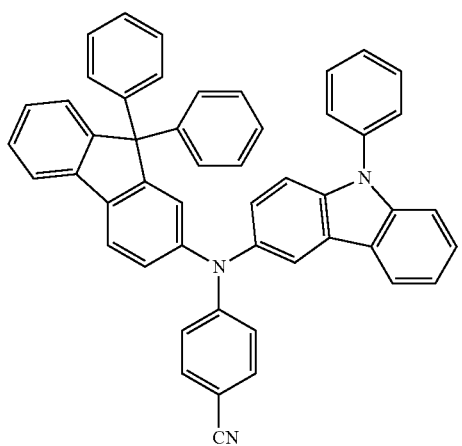
33
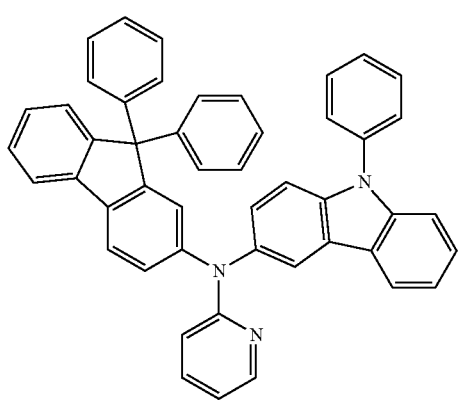
34
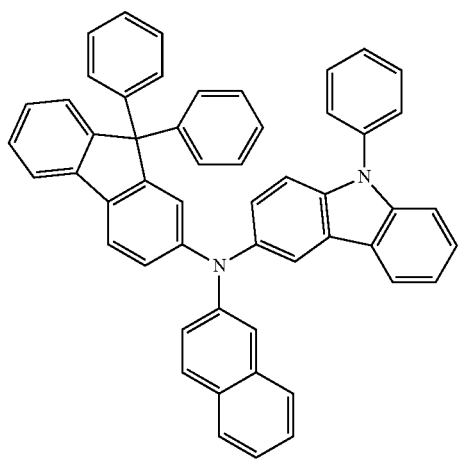
35
36
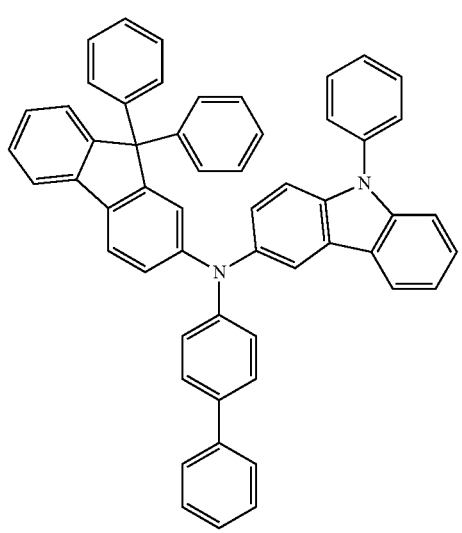

37
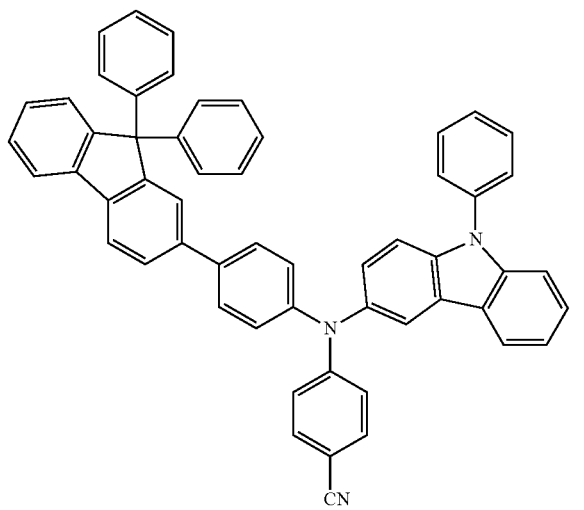
38
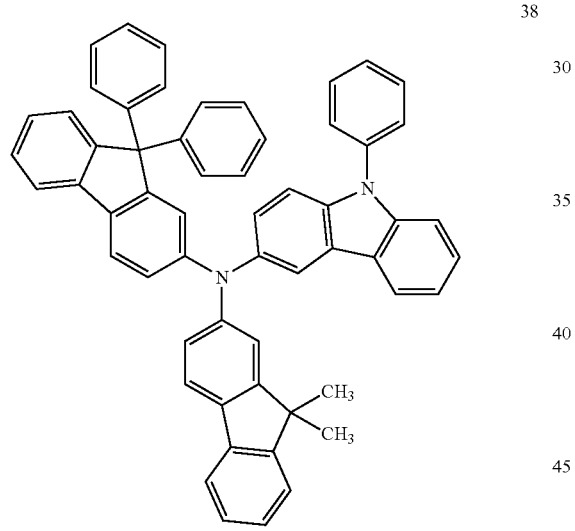
39
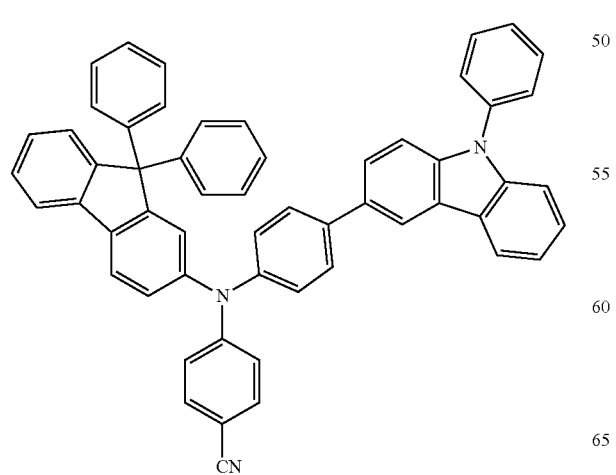
40
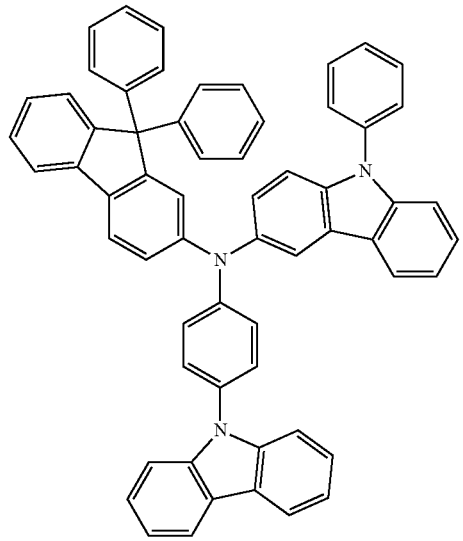
41
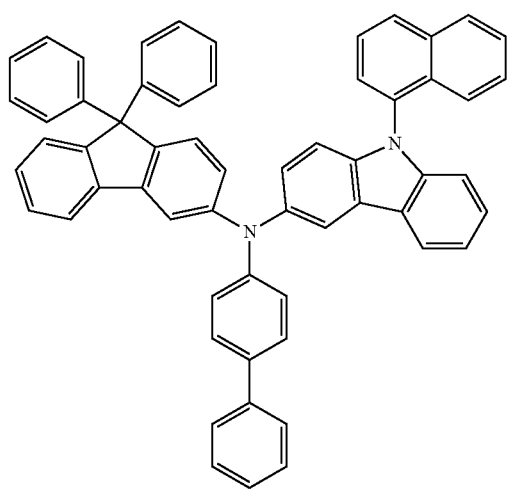

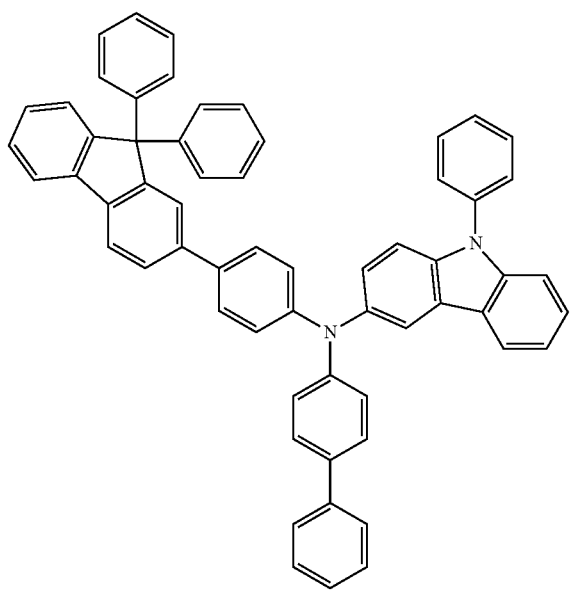

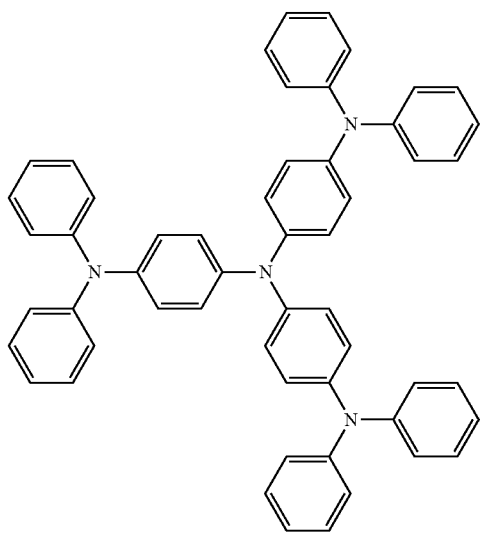

TDATA

The carbazole-based compound represented by Formula 2 may be synthesized by a suitable organic synthesis method. A synthesis method of the carbazole-based compound may be easily understood by referring to the Examples described below.

The HIL may further include a hole injection material. Examples of the hole injection material include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate (PEDOT/PSS), polyaniline/camphor sulfonic acid (pani/CSA), or (polyaniline)/poly(4-styrenesulfonate) (PANI/PSS):

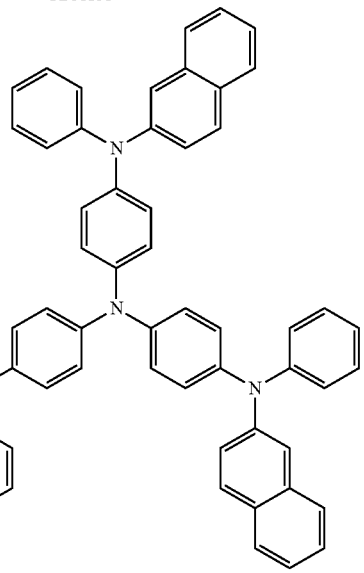

2-TNATA

At least one of the HIL, the HTL, and the H-functional layer may further include a carbazole derivative, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphthyl)-N,N'-diphenylbenzidine (NPB), or the like, but it is not limited thereto.

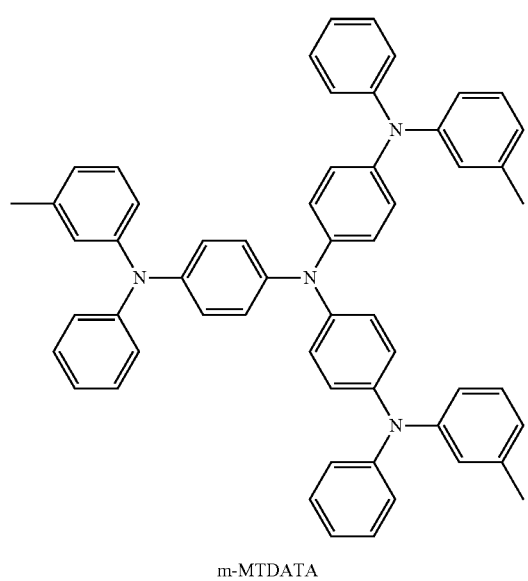

m-MTDATA

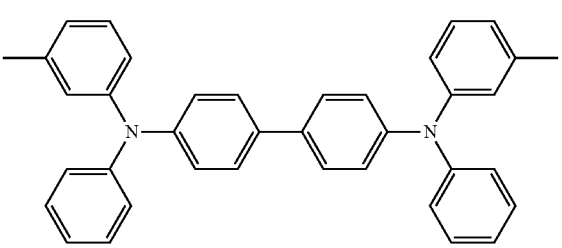

TPD

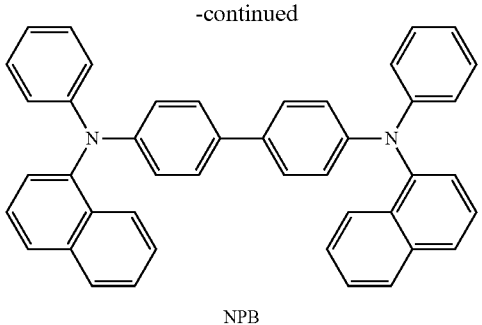

NPB

At least one of the HIL, the HTL, and the H-functional layer may further include a charge-generating material in addition to the hole injection material, a hole transport material, and a material having hole injection and/or hole transport capabilities to improve conductivity of a film or the like.

The charge-generating material may be, for example, a p-dopant. The p-dopant may be one of quinone derivatives, metal oxides, and compounds with a cyano group, but the p-dopant is not limited thereto. For example, non-limiting examples of the p-dopant are quinone derivatives, such as tetracyanoquinodimethane (TCNQ), and 2,3,5,6-tetrafluoro-tetracyano-1,4-benzoquinodimethane (F4-TCNQ); metal oxides such as tungsten oxides and molybdenym oxides; and cyano group-containing compounds, such as Compound 200 below, but the p-dopant is not limited thereto.

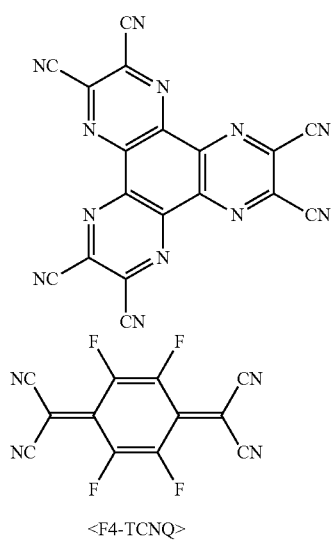

<Compound 200>

<F4-TCNQ>

When the HIL, the HTL, or the H-functional layer further includes the charge-generating material, the charge-generating material may be homogeneously or non-homogeneously dispersed in the HIL, the HTL, or the H-functional layer.

A buffer layer may be between at least one of the HIL, the HTL, and the H-functional layer and the EML. The buffer layer may help compensate for an optical resonance distance of light according to a wavelength of the light emitted from the EML, and thus may increase efficiency. The buffer layer may include a suitable hole injecting material or hole transporting material. In an implementation, the buffer layer may include the same material as one of the materials included in the HIL, the HTL, and the H-functional layer that underlie the buffer layer.

Then, the EML may be formed on the hole transport region by vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

As the host, Alq3, 4,4'-N,N'-dicarbazol-biphenyl (CBP), poly(n-vinylcarbazole) (PVK), 9,10-di(naphthalen-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), mCP, OXD-7, or the like may be used, but the host is not limited thereto.

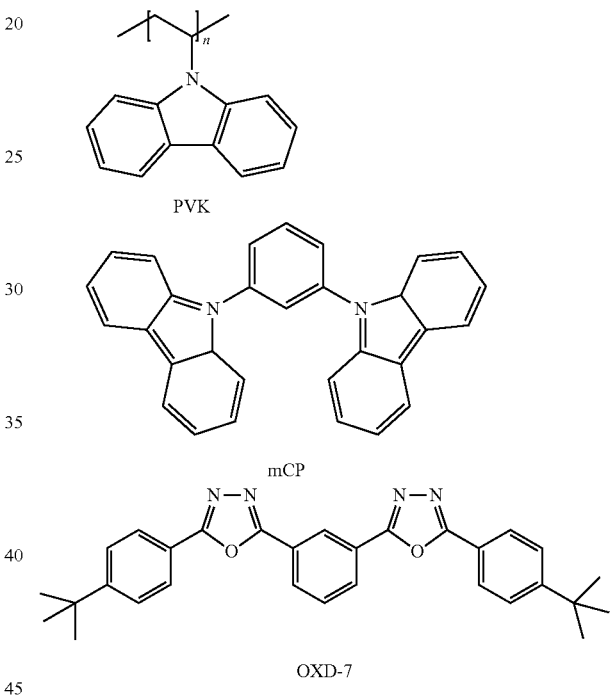

PVK mCP

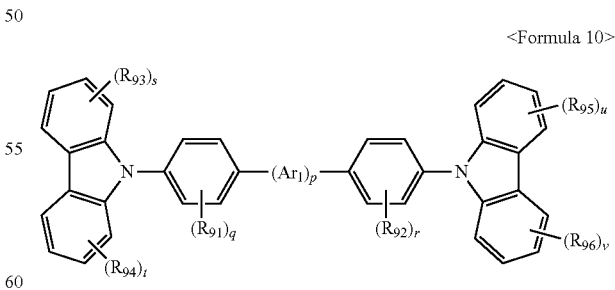

OXD-7

In an implementation, a carbazole-based compound represented by Formula 10, below, may be used as the host:

<Formula 10>

In Formula 10, $Ar_1$ may be selected from a substituted or unsubstituted $C_1$-$C_{60}$ alkylene group, a substituted or unsubstituted $C_2$-$C_{60}$ alkenylene group, —C(=O)—, —N($R_{100}$)— (wherein, $R_{100}$ is a substituted or unsubstituted $C_6$-$C_{60}$ aryl group or a substituted or unsubstituted $C_2$-$C_{60}$ heteroaryl group), a substituted or unsubstituted $C_6$-$C_{60}$ arylene group, or a substituted or unsubstituted $C_2$-$C_{60}$ heteroarylene group; p is an integer selected from 0 to 10; $R_{91}$ to $R_{96}$ may be each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group, wherein two neighboring substituents of $R_{91}$ to $R_{96}$ bind to each other to selectively form a substituted or unsubstituted $C_4$-$C_{20}$ alicyclic ring, a substituted or unsubstituted $C_2$-$C_{20}$ heteroalicyclic ring, a substituted or unsubstituted $C_6$-$C_{20}$ aromatic ring, or a substituted or unsubstituted $C_2$-$C_{20}$ heteroaromatic ring; and q, r, s, t, u, and v may be each independently an integer selected from 1 to 4.

In Formula 10, $Ar_1$ may be a $C_1$-$C_5$ alkylene group, a $C_2$-$C_5$ alkenylene group, —C(=O)—, or —N($R_{100}$)—. In this regard, $R_{100}$ may be any one selected from a phenyl group, a naphthyl group, an anthryl group, a fluorenyl group, a carbazolyl group, a pyridinyl group, a pyrimidinyl group, and a triazinyl group; a phenyl group, a naphthyl group, an anthryl group, a fluorenyl group, a carbazolyl group, a pyridinyl group, a pyrimidinyl group, and a triazinyl group, each substituted with at least one of a deuterium, a halogen atom, a hydroxyl group, a cyano group, a nitro group, an amino group, a $C_1$-$C_{20}$ alkyl group, a $C_1$-$C_{20}$ alkoxy group, a phenyl group, a naphthyl group, an anthryl group, a fluorenyl group, a carbazolyl group, a pyridinyl group, a pyrimidinyl group, and a triazinyl group.

In Formula 10, $R_{91}$ to $R_{96}$ may be each independently any one of a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group; and a $C_1$-$C_{20}$ alkyl group and a $C_1$-$C_{20}$ alkoxy group, each substituted with at least one of a deuterium, a halogen atom, a hydroxyl group, a cyano group, a nitro group, and an amino group.

The carbazole-based compound represented by Formula 10 may include one of the compounds below, but it is not limited thereto.

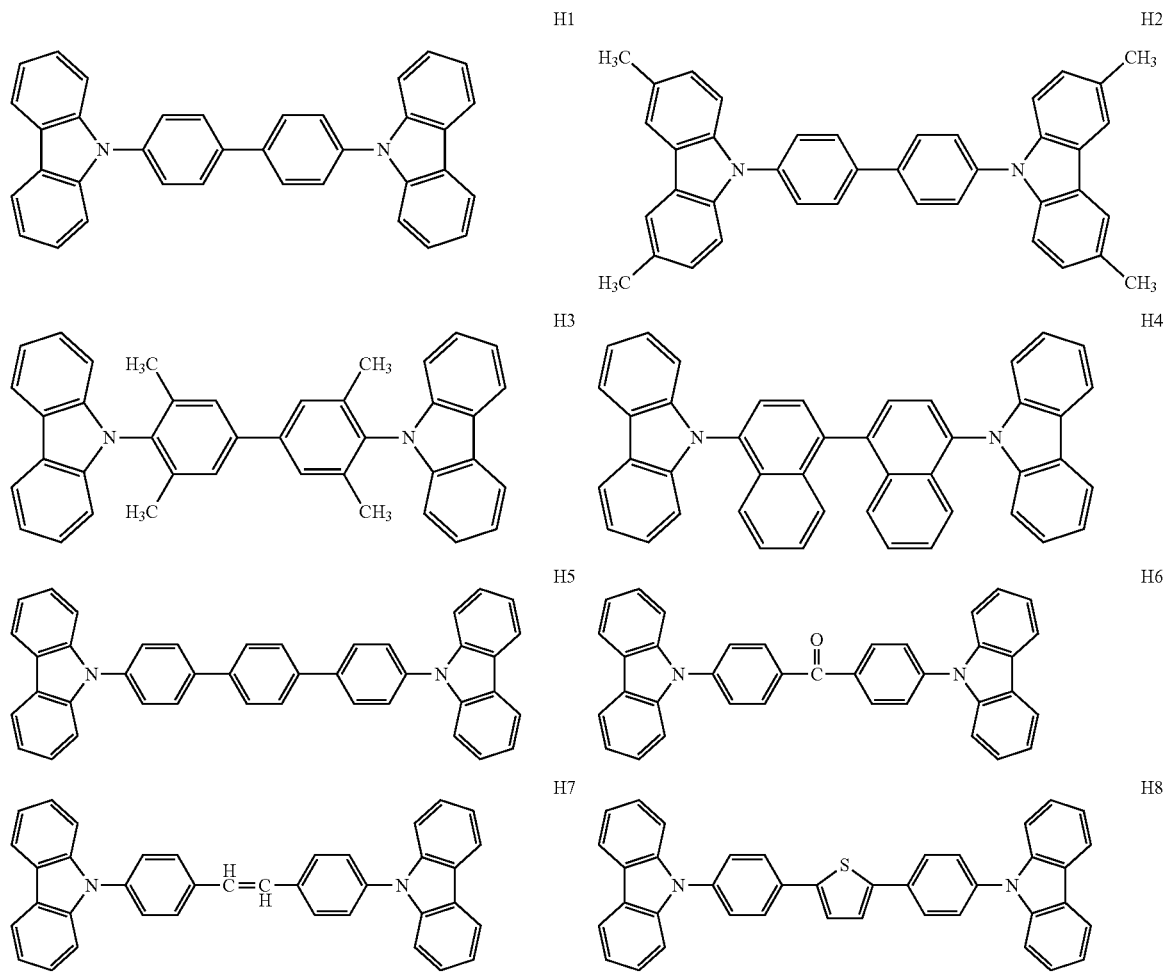

-continued
H9
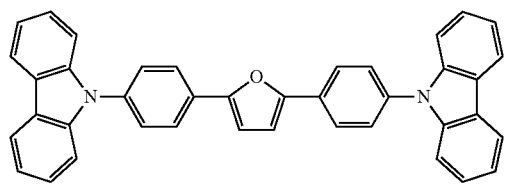
H10
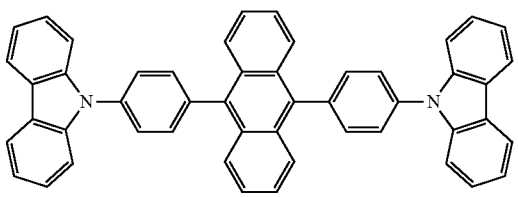
H11
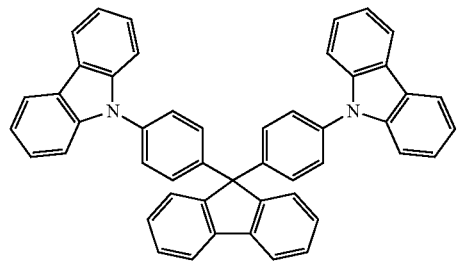
H12
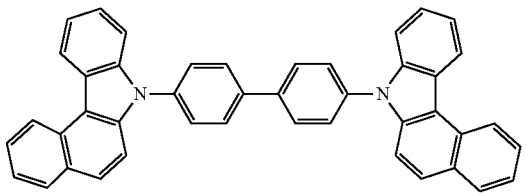
H13
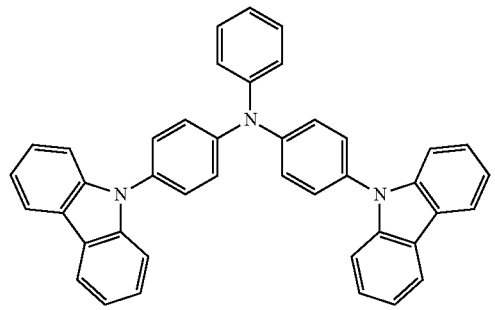
H14
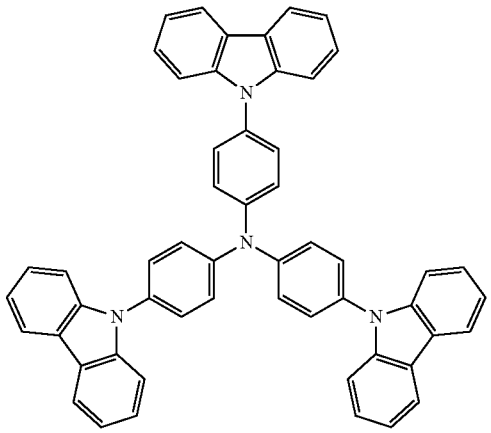
H15
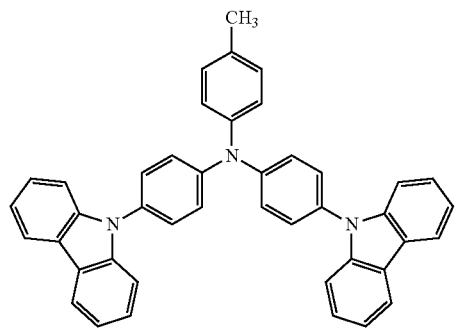
H16
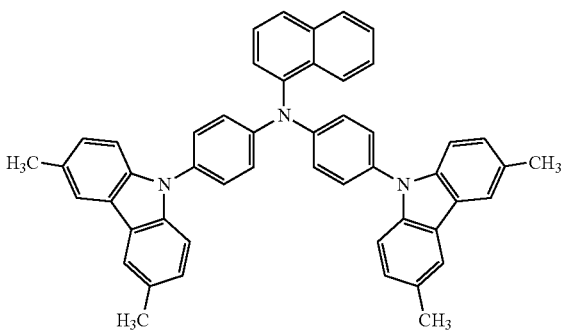

-continued
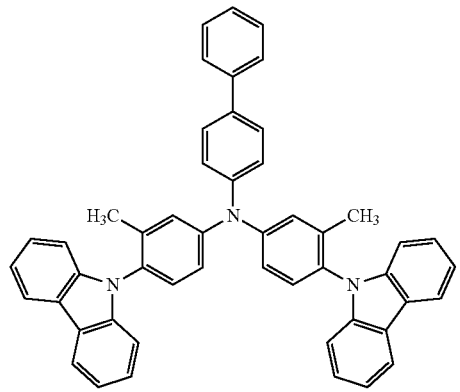
H17
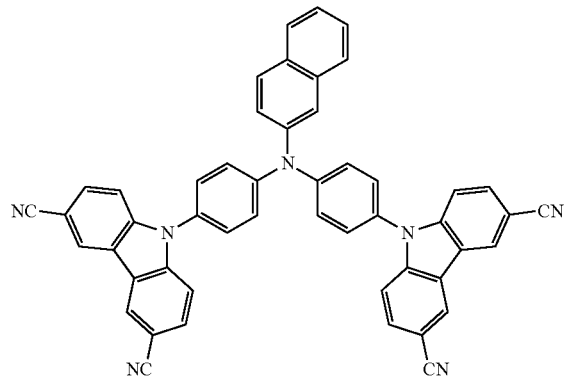
H18
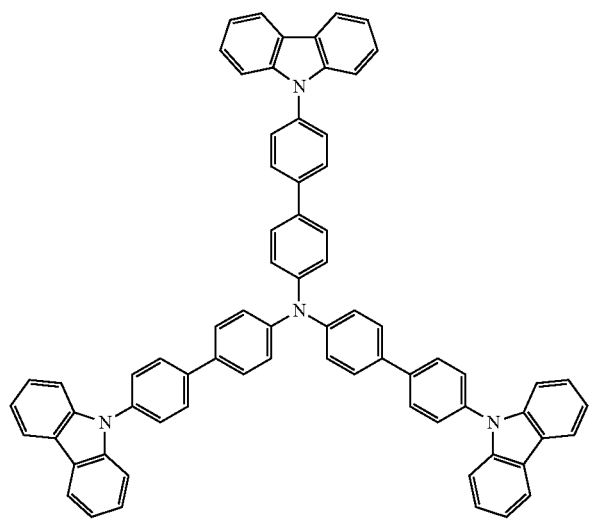
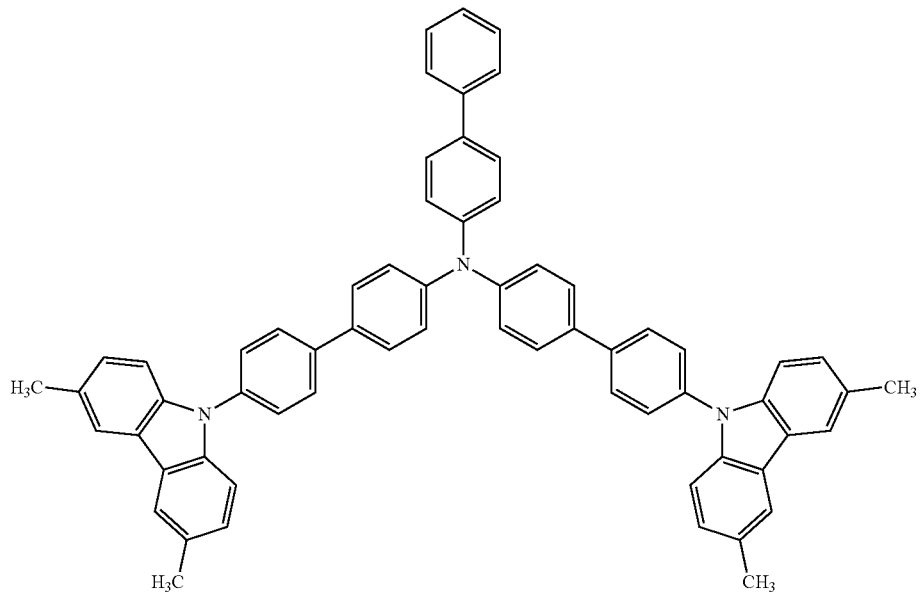
H19
H20

-continued
H21
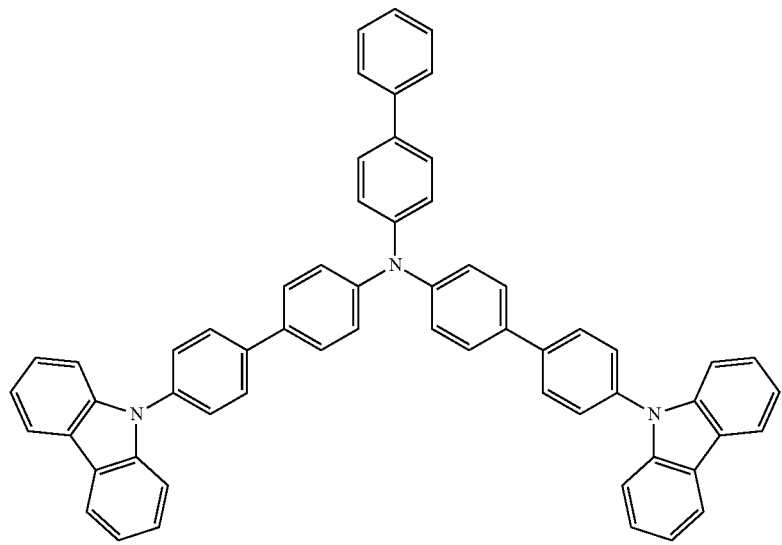
H22
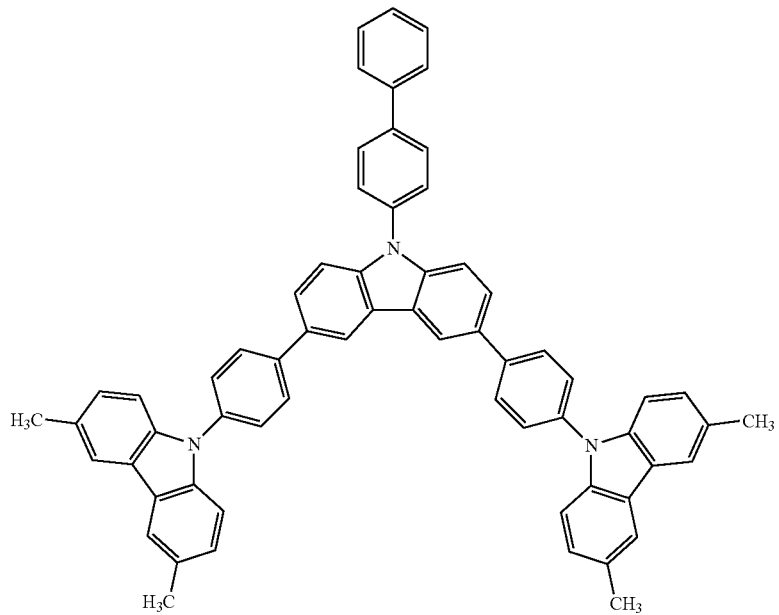
H23
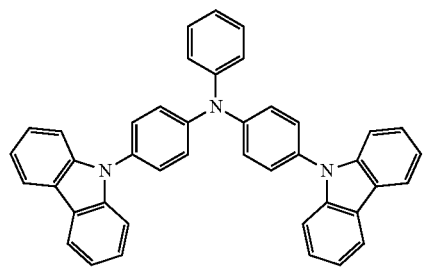
H24
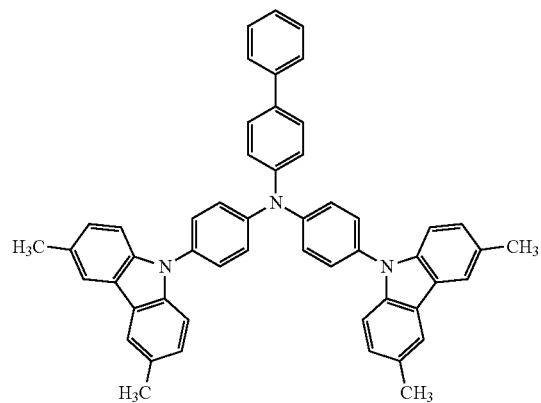

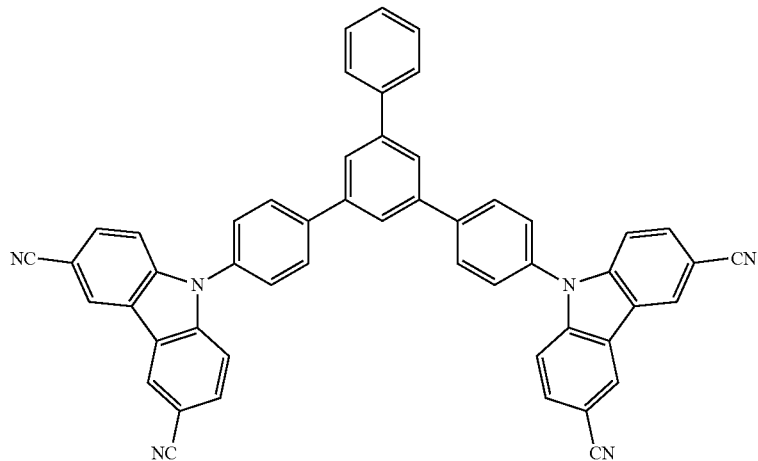
H25
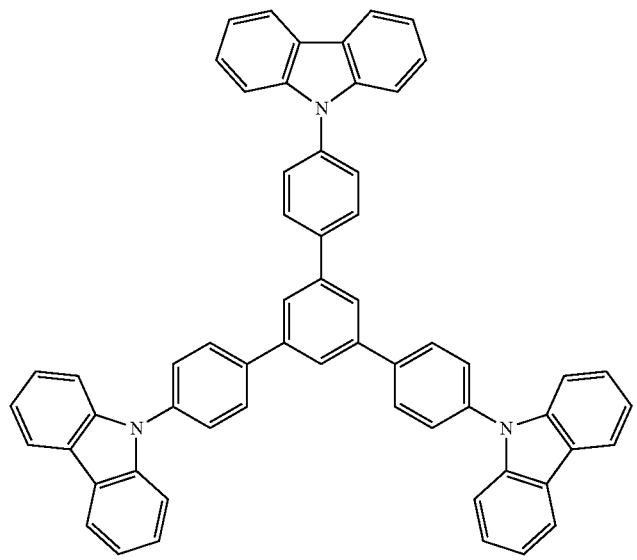
H26
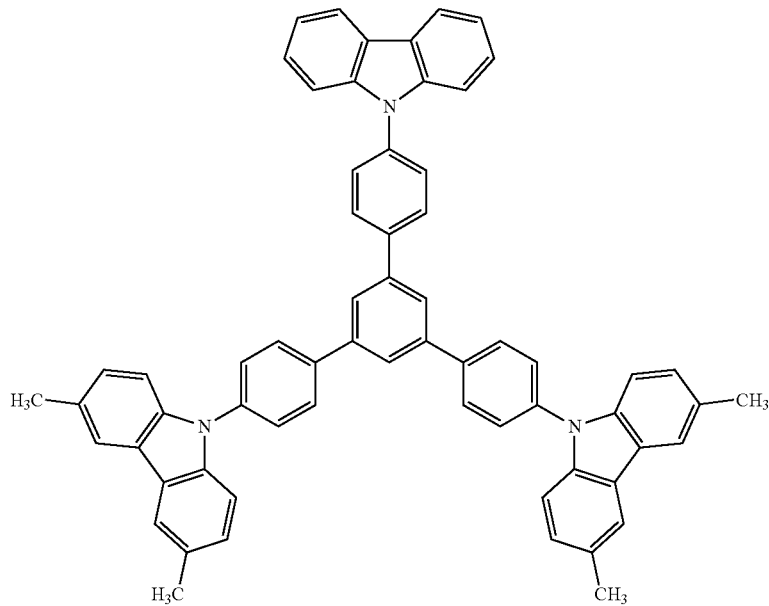
H27

-continued
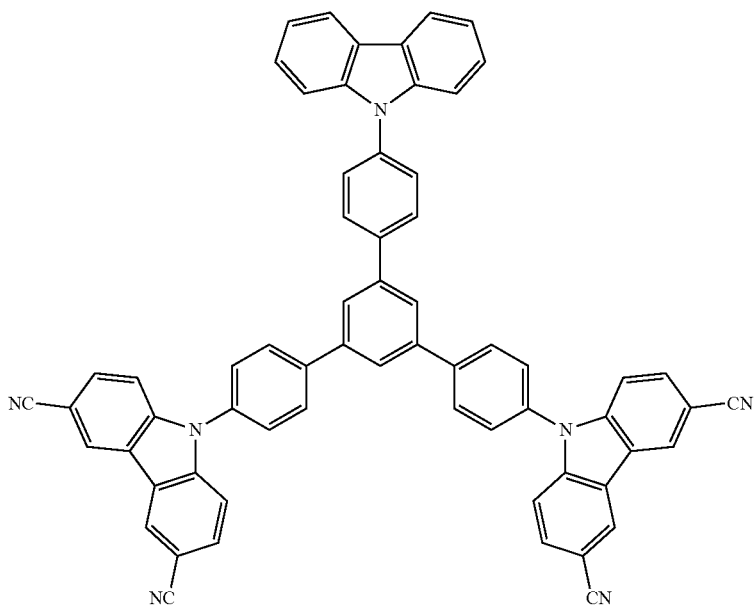
H28
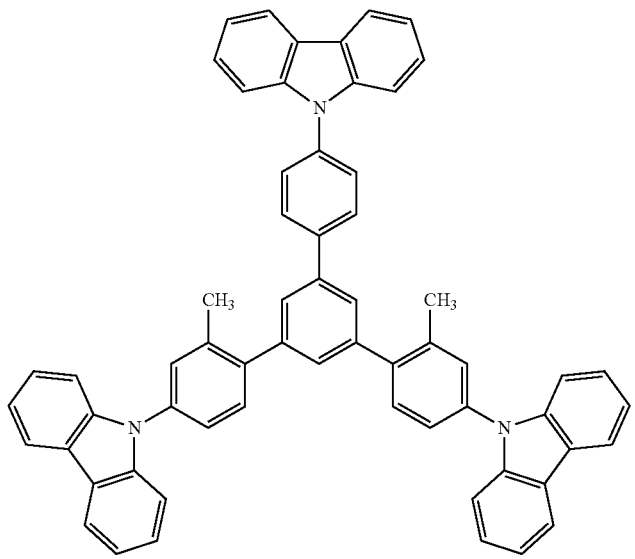
H29

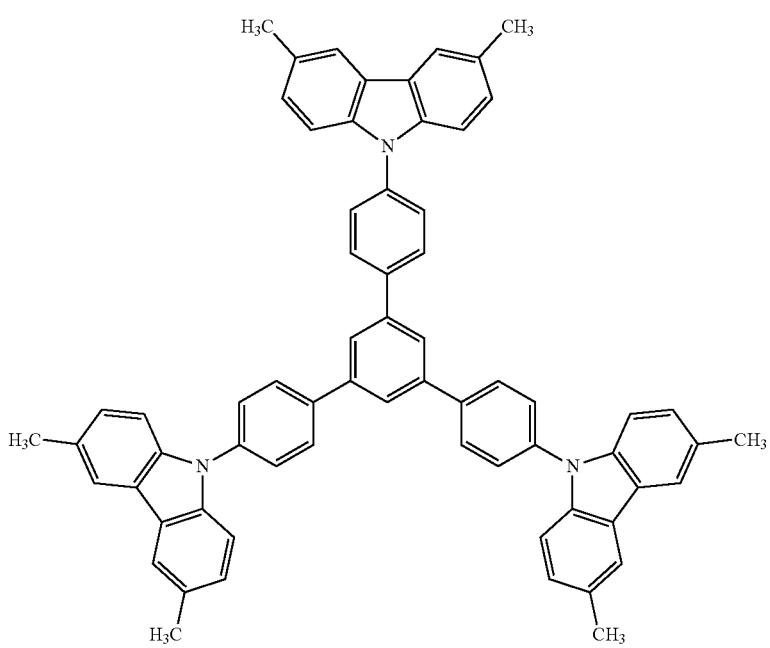

H30

The EML may include at least one of the compounds above. The organometallic compound included in the EML may act as a dopant (for example, a green phosphorescent dopant). In this regard, the EML may further include a host in addition to the organometallic compound.

The organometallic compound may be represented by Formula 1, below.

<Formula 1>

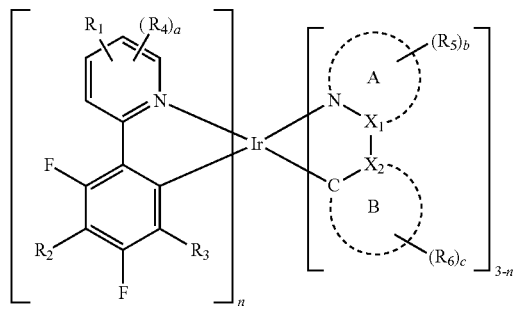

In Formula 1, $R_1$ may be selected from a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), —C(=O)($Q_3$), and —Si($Q_4$)($Q_5$)($Q_6$) (wherein, $Q_1$ to $Q_6$ may be each independently a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{30}$ aryl group, or a substituted or unsubstituted $C_2$-$C_{30}$ heteroaryl group); and $R_2$ to $R_6$ may be each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, —N($Q_1$)($Q_2$), —C(=O)($Q_3$), and —Si($Q_4$)($Q_5$)($Q_6$) (wherein, $Q_1$ to $Q_6$ are each independently a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{30}$ aryl group, or a substituted or unsubstituted $C_2$-$C_{30}$ heteroaryl group).

For example, in Formula 1, $R_1$ may be selected from a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group;

a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group;

—N($Q_1$)($Q_2$); and —C(=O)($Q_3$);

$R_2$ to $R_6$ may be each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group;

a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group;

—N($Q_1$)($Q_2$); and —C(=O)($Q_3$), wherein $Q_1$ to $Q_3$ may be each independently selected from a hydrogen, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group; and a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, and a $C_1$-$C_{20}$ alkyl group, a $C_1$-$C_{20}$ alkoxy group, a $C_6$-$C_{14}$ aryl group, and a $C_2$-$C_{14}$ heteroaryl group, each substituted with at least one F.

In an implementation, in Formula 1, $R_1$ may be selected from i) a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl;

ii) a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

iii) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group;

iv) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group;

v) —N($Q_1$)($Q_2$); and vi) —C(=O)($Q_3$).

$R_2$ to $R_6$ may be each independently selected from:

i) a hydrogen, a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl;

ii) a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

iii) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group;

iv) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group;

v) —N($Q_1$)($Q_2$); and vi) —C(=O)($Q_3$), wherein $Q_1$ to $Q_3$ may be each independently selected from:

i) a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl;

ii) a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

iii) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group; and iv) a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, and a $C_1$-$C_{20}$ alkyl group (for example, —$CF_3$ or the like) substituted with at least one —F, a $C_1$-$C_{20}$ alkoxy group, a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group.

For example, in Formula 1, $R_1$ may be selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, a tert-decanyl group, and —N($Q_1$)($Q_2$), wherein $Q_1$ and $Q_2$ may be each independently selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, and a tert-decanyl group;

a phenyl group, a naphthyl group, an anthryl group, a pyrenyl group, a phenanthrenyl group, and a fluorenyl group; and a phenyl group, a naphthyl group, an anthryl group, a pyrenyl group, a phenanthrenyl group, and a fluorenyl group, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group.

In an implementation, in Formula 1, $R_2$ may be selected from a hydrogen, a halogen atom, a cyano group, and a nitro group; a $C_1$-$C_{60}$ alkyl group substituted with at least one halogen atom; a $C_6$-$C_{30}$ aryl group, and a $C_2$-$C_{30}$ heteroaryl group, each substituted with at least one halogen atom; and —C(=O)($Q_3$); wherein $Q_3$ is a $C_1$-$C_{60}$ alkyl group substituted with at least one halogen atom; and a $C_6$-$C_{30}$ aryl group and a $C_2$-$C_{30}$ heteroaryl group, each substituted with a halogen atom and a $C_1$-$C_{20}$ alkyl group substituted with at least one halogen atom.

For example, in Formula 1, $R_2$ may be selected from a hydrogen, —F, —Cl, a cyano group, and a nitro group;

a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, and a tert-decanyl group, each substituted with at least one F;

a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one F; and —(=O)($Q_3$);

wherein $Q_1$ to $Q_3$ are each independently a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F; a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with F and a $C_1$-$C_{20}$ alkyl group substituted with at least one F.

In Formula 1, $R_3$ may be a hydrogen.

In Formula 1, a represents the number of $R_4$s, wherein a is an integer selected from 1 to 3 and when a is 2 or greater, two or more $R_4$s may be the same or different.

In Formula 1, b and c may be each independently an integer selected from 1 to 6 and when b is 2 or greater, two or more $R_5$s may be the same or different and when c is 2 or greater, two or more $R_6$s may be the same or different. b represents the number of $R_5$s, and $R_5$ is a substituent of ring A in Formula 1. When $R_5$ is a hydrogen, ring A in Formula 1 may be an unsubstituted ring. c represents the number of $R_6$s, wherein $R_6$ is a substituent of ring B in Formula 1. When $R_6$ is a hydrogen, ring B in Formula 1 may be an unsubstituted ring.

In Formula 1, A may form a ring structure selected from a pyrrole, an imidazole, a pyrazole, a triazole, a thiazole, an oxazole, an isothiazole, an isoxazole, a benzothiazole, a benzimidazole, a benzoxazole, a pyridine, a pyrazine, a pyrimidine, a pyridazine, an isoindole, an indole, an indazole, a purine, an isoquinoline, a quinoline, a phthalazine, a naphthyridine, a quinoxaline, a quinazoline, a cinnoline, a phenanthridine, an acridine, a phenanthroline, a phenazine, and a phenoxazine. For example, N and $X_1$ in Formula 1 may be included in the ring structure of A.

In Formula 1, B may form a ring structure selected from a benzene, a pentalene, an indene, a naphtalene, an azulene, a heptalene, an indacene, an acenaphthylene, a fluorene, a spiro-fluorene, a phenalene, a phenanthrene, an anthracene, a fluoranthene, a triphenylene, a pyrene, a chrysene, a pyrrole, an imidazole, a pyrazole, a triazole, an isothiazole, an isoxazole, a pyridine, a pyrazine, a pyrimidine, a pyridazine, an isoindole, an indole, an indazole, a purine, an isoquinoline, a quinoline, a phthalazine, a naphthyridine, a quinoxaline, a quinazoline, a cinnoline, a phenanthridine, an acridine, a phenanthroline, a phenazine, and a phenoxazine. For example, C and $X_2$ in Formula 1 may be included in the ring structure of B.

For example, in Formula 1, A may form a pyridine, a pyrimidine, a pyrazine, or a pyrazole, but it is not limited thereto. In an implementation, in Formula 1, A may form a pyridine or a pyrazole.

In Formula 1, B may form a benzene or a naphthalene, but it is not limited thereto. In an implementation, B may form a benzene, but it is not limited thereto.

In Formula 1, $X_1$ and $X_2$ may be each independently N or C. According to an embodiment, $X_1$ may be each independently N or C, and $X_2$ may be C.

In an implementation, the organometallic compound represented by Formula 1 may be represented by Formula 1A, below:

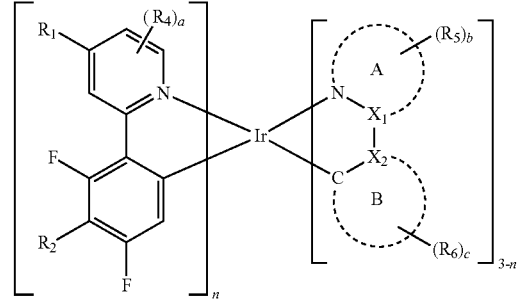

<Formula 1A>

In Formula 1A, descriptions of $R_1$ $R_2$, $R_4$ to $R_6$, a, b, c, A, B, $X_1$, $X_2$ and n are the same as described herein.

In an implementation, the organometallic compound represented by Formula 1 may be represented by Formula 1B or 1C, but it is not limited thereto:

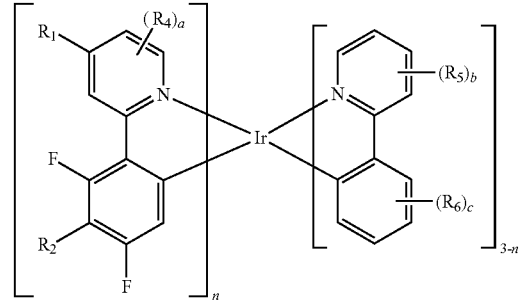

<Formula 1B>

<Formula 1C>

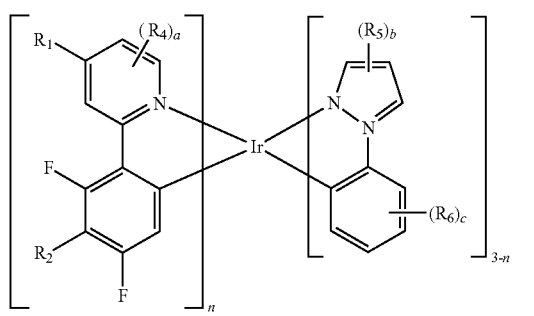

In Formulae 1B and 1C, descriptions of $R_1$, $R_2$, $R_4$ to $R_6$, a, b, c, and n are the same as described herein.

For example, in Formulae 1B and 1C, $R_1$ may be a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group;

a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group; —N($Q_1$)($Q_2$); and —C(=O)($Q_3$);

$R_2$ and $R_4$ to $R_6$ may be each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group;

a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group;

—N($Q_1$)($Q_2$); and —C(=O)($Q_3$), wherein $Q_1$ to $Q_3$ may be each independently selected from:

a hydrogen, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof; and a $C_6$-$C_{14}$ aryl group and a $C_2$-$C_{14}$ heteroaryl group; and a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, and a $C_1$-$C_{20}$ alkyl group, a $C_1$-$C_{20}$ alkyl group, a $C_1$-$C_{20}$ alkoxy group, a $C_6$-$C_{14}$ aryl group, and a $C_2$-$C_{14}$ heteroaryl group, each substituted with at least one F;

a, b and c may be each independently an integer of 1 to 3 and when a is 2 or greater, two or more $R_4$s may be the same or different, when b is 2 or greater, two or more $R_5$s may be the same or different, and when c is 2 or greater, two or more $R_6$s may be the same or different, and n may be 1 or 2.

In an implementation, in Formulae 1B and 1C, $R_1$ may be selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, a tert-decanyl, and —N($Q_1$)($Q_2$), $R_2$ may be selected from a hydrogen, —F, —Cl, a cyano group, and a nitro group;

a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl and a tert-decanyl, each substituted with at least one F;

a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one F; and —C(=O)($Q_3$);

wherein $Q_1$ to $Q_3$ are each independently a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, and a tert-decanyl group, each substituted with at least one F; and a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with F and a $C_1$-$C_{20}$ alkyl group substituted with at least one F; and $R_4$ to $R_6$ may be a hydrogen, but they are not limited thereto.

The organometallic compound represented by Formula 1 may include one of Compounds 1 to 16, but it is not limited thereto.

1
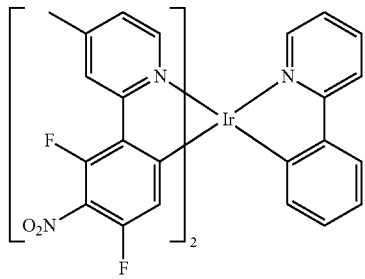

2
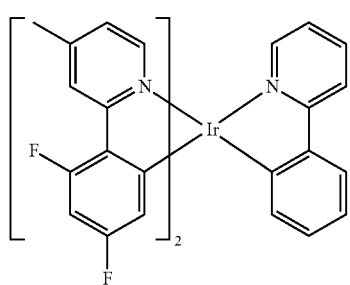

3
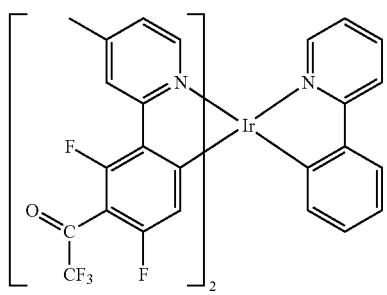

4
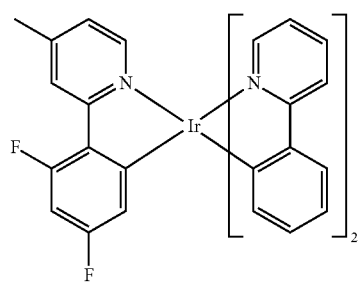

5
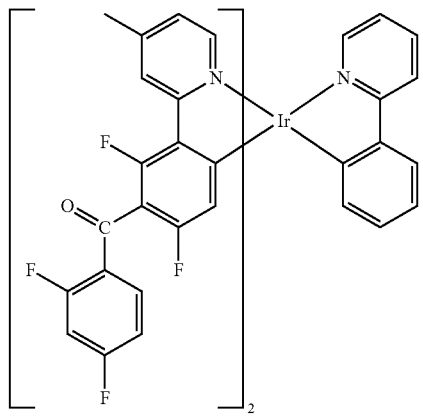

6
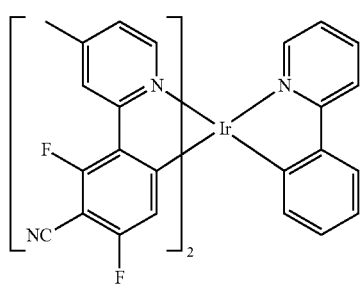

7
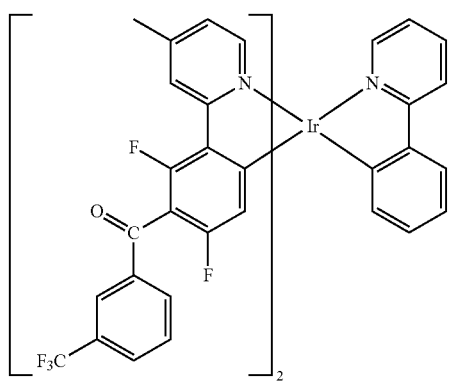

8
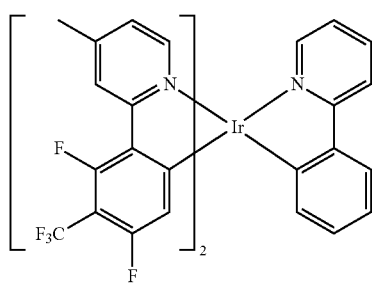

9

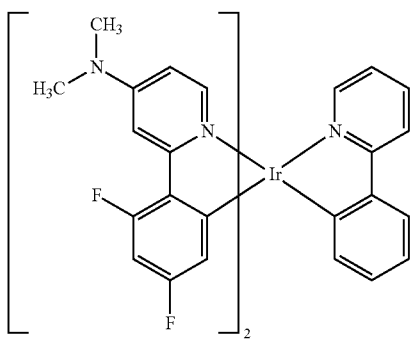

10

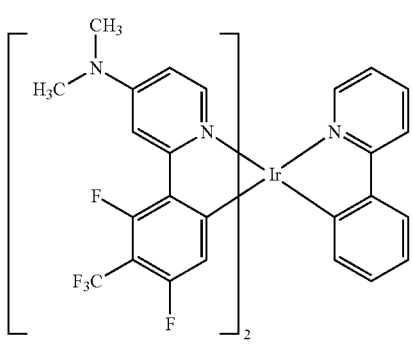

11

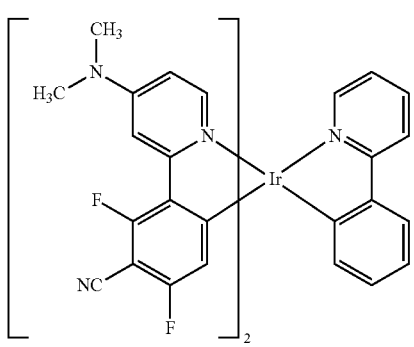

12

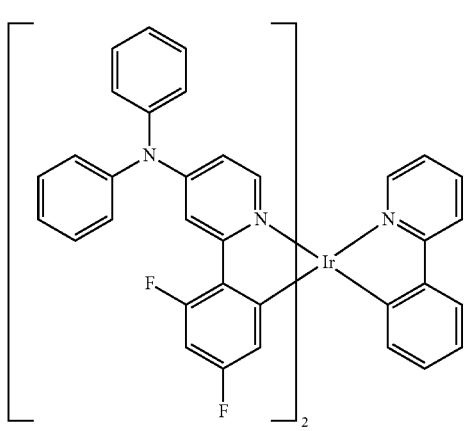

13

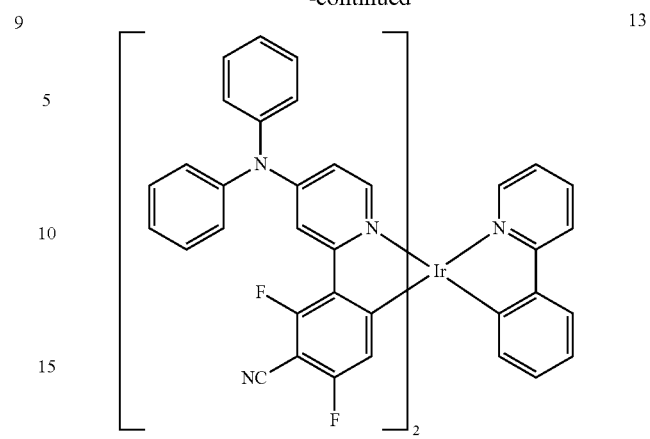

14

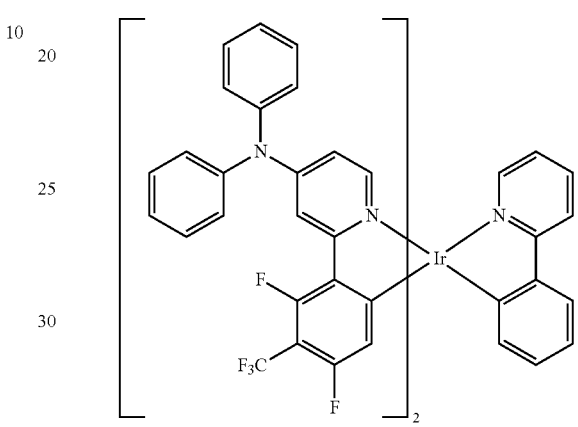

15

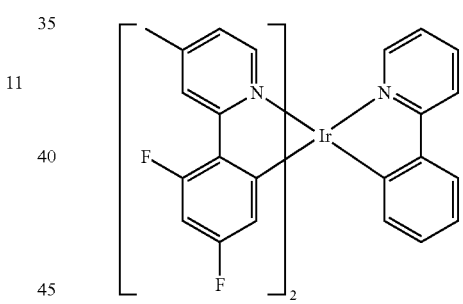

16

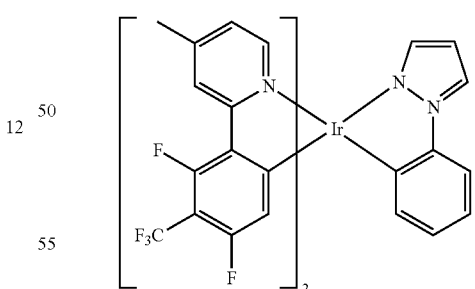

The organometallic compound represented by Formula 1 may be synthesized by a suitable organic synthesis method. A synthesis method of the organometallic compound may be easily understood by referring to the Examples described below.

When the EML includes a host and a dopant (the organometallic compound represented by Formula 1), an amount of the dopant may be selected from a range of about 0.01 wt % to about 15 wt %, based on 100 wt % of the EML, but the amount is not limited thereto.

A thickness of the EML may be about 200 Å to about 700 Å. When the thickness of the EML is in the range described above, the EML may have excellent light emitting ability without a substantial increase in driving voltage.

Meanwhile, when the organic light-emitting device is a full color organic light-emitting device, the EML may be patterned into a red EML, a green EML, and a blue EML, according to a red subpixel, a green subpixel, and a blue subpixel, respectively. In this regard, the blue EML may include the organometallic compound represented by Formula 1 as a dopant.

Meanwhile, the EML may have a multi-layered structure in which the red EML, the green EML, and the blue EML are layered to emit white light or a single-layered structure simultaneously including a red emission material, a green emission material, and a blue emission material. The organic light-emitting device including the EML further includes a red color filter, a green color filter, and a blue color filter to emit full colors.

Then, the ETL is formed an the EML by various methods such as vacuum deposition, spin coating, or casting. When the ETL is formed by vacuum deposition or spin coating, the deposition and coating conditions may be similar to those for forming the HIL, though the deposition and coating conditions may vary according to a compound that is used to form the ETL.

An electron-transporting material may be any suitable electron-transporting material that may stably transport electrons injected from an electron injection electrode (cathode). Non-limiting examples of the electron-transporting material are quinoline derivatives, such as tris(8-quinolinorate)aluminum (Alq3), TAZ, BAlq, beryllium bis(benzoquinolin-10-olate) (Bebq2), 9,10-di(naphthalene-2-yl)anthracene (ADN), Compound 101, Compound 102, and Bphen, but they are not limited thereto.

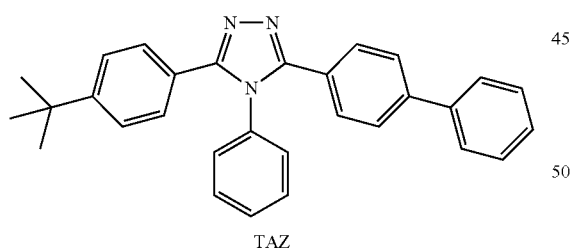

TAZ

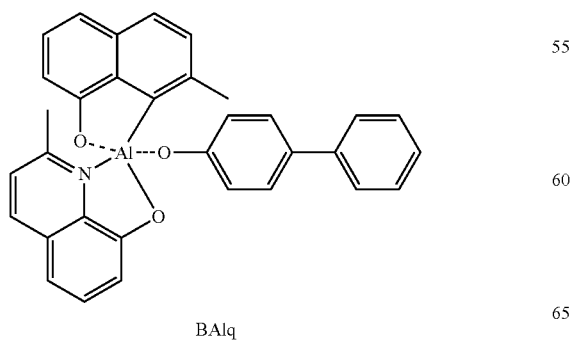

BAlq

<Compound 101>

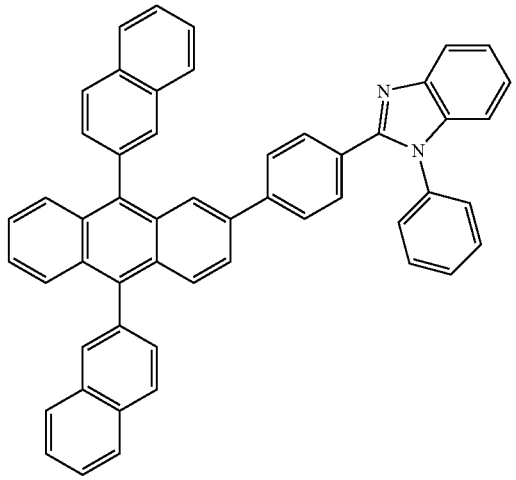

<Compound 102>

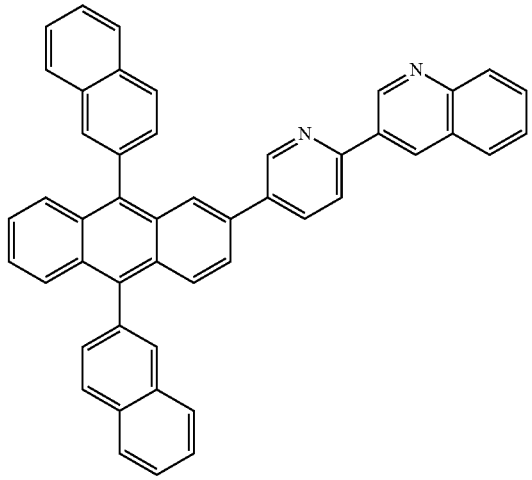

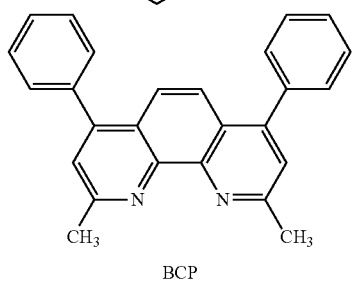

BCP

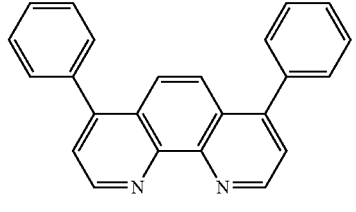

BPhen

A thickness of the ETL may be from about 100 Å to about 1,000 Å, and in some embodiments, may be from about 150 Å to about 500 Å. When the thickness of the ETL is within these ranges, the ETL may have a satisfactory electron transporting ability without a substantial increase in driving voltage.

In an implementation, the ETL may further include a metal-containing material in addition to any suitable electron-transporting organic compound.

The metal-containing material may include a Li complex. Non-limiting examples of the Li complex are lithium quinolate (LiQ) and Compound 203 below:

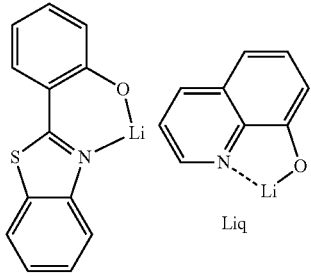

<Compound 203>

Liq

Then, the EIL, which facilitates the injection of electrons from the cathode, may be formed on the ETL. Any suitable electron-injecting material may be used to form the EIL.

Non-limiting examples of the materials for forming the EIL are an EIL material such as LiF, NaCl, CsF, $Li_2O$, and BaO. The deposition conditions for forming the EIL may be similar to those for the formation of the HIL, though the deposition conditions may vary according to the compound that is used to form the EIL.

A thickness of the EIL may be from about 1 Å to about 100 Å, and in some embodiments, may be from about 3 Å to about 90 Å. When, the thickness of the EIL is within these ranges, the EIL may have a satisfactory electron injection ability without a substantial increase in driving voltage.

The second electrode 17 may be on the organic layer 15. The second electrode 17 may be a cathode that is an electron injection electrode, wherein a material for forming the second electrode 17 may include a metal, an alloy, and an electro-conductive compound, which have a low work function, or a mixture thereof. In this regard, the second electrode 17 may be formed of lithium (Li), magnesium (Mg), aluminum (Al), aluminum lithium (Al—Li), calcium (Ca), magnesium-indium (Mg—In), magnesium-silver (Mg—Ag), or the like, which may be formed as a thin film type transmission electrode. In some embodiments, to manufacture a top-emission light-emitting device, the transmission electrode may be formed of ITO or IZO.

Although the organic light-emitting device 10 of the FIGURE is described above, the embodiments are not limited thereto.

When a phosphorescent dopant is used in the EML, the HBL may be formed between the ETL and the EML by using vacuum deposition, spin coating, casting, LB deposition, or the like, in order to prevent diffusion of triplet excitons or holes into the ETL. When the HBL is formed by using vacuum deposition or spin coating, the conditions for deposition and coating may be similar to those for the formation of the HIL, although the conditions for deposition and coating may vary according to the compound that is used to form the HBL. A suitable hole-blocking material may be used, and non-limiting examples of the hole-blocking material include oxadiazole derivatives, triazole derivatives, phenanthroline derivatives, or the like. In some embodiments, BCP shown below may be used as a hole-blocking material.

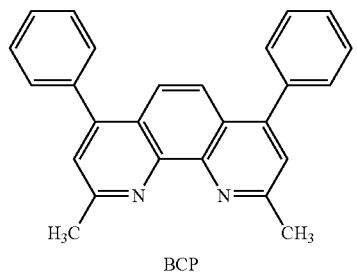

BCP

A thickness of the HBL may be from about 20 Å to about 1,000 Å, and in some embodiments, may be from about 30 Å to about 300 Å. When the thickness of the HBL is within these ranges, the HBL may have an improved hole blocking ability without a substantial increase in driving voltage.

The organometallic compound represented by Formula 1 may include a first fluorine and a second fluorine (as may be seen in Formula 1', below), and thus, an electron density of a benzene ring (that is combined with or bound to the first fluorine and the second fluorine) may become low. As a result, light emitted by the organometallic compound may have a short wavelength shift, e.g., the light may be blue shifted light. Also, ligands of the organometallic compound may easily trap electrons and thus, a great amount of excitons may be formed with holes that are injected into the EML. As a result, the organic light-emitting device including the organometallic compound may have high emission efficiency.

A pyridine ring (among the ligands) may include an $R_1$ substituent, which may include an alkyl group or the like, such that the electron density of the pyridine ring may be adjusted, and thus, emission color may be easily moved to a short wavelength or a long wavelength and an amount of electrons or holes trapped may be adjusted, such that the organic light-emitting device including the organometallic compound may have high emission efficiency.

In an implementation, when $R_2$ in Formula 1' is an electron withdrawing group, the electron density of the benzene ring bound to $R_2$ may be further lowered. As a result, light emitted from the organometallic compound may have a short wavelength shift, e.g., blue shifted light. Also, the ligands of the organometallic compound may easily trap electrons and thus, a great amount of excitons may be formed along with holes injected into the EML. As a result, the organic light-emitting device including the organometallic compound may have high emission efficiency.

Accordingly, the organometallic compound represented by Formula 1 may emit light of variously tuned colors and may simultaneously provide high emission efficiency.

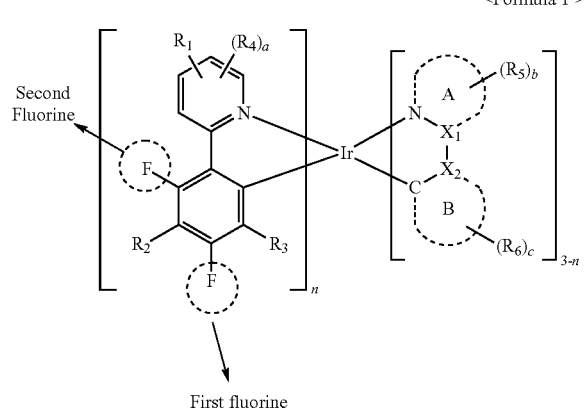

<Formula 1'>

First fluorine

Second Fluorine

The carbazole-based compound represented by Formula 2 may stably inject and transport holes to lower a driving voltage of the organic light-emitting device 10.

The organometallic compound represented by Formula 1 and the carbazole-based compound represented by Formula 2 may have each of the HOMO and LUMO energy levels adjusted to facilitate the movement of charges from the hole transport region to the EML. Accordingly, more charges may move from the hole transport region to the EML in the organic light-emitting device 10. Accordingly, as more excitons are formed due to a combination of the holes and the electrons in the EML, the efficiency and brightness of the organic light-emitting device 10 may increase.

The unsubstituted $C_1$-$C_{60}$ alkyl group (or a $C_1$-$C_{60}$ alkyl group) used herein may be a linear or branched $C_1$-$C_{60}$ alkyl group, such as methyl, ethyl, propyl, isobutyl sec-butyl, pentyl, iso-amyl, or hexyl, wherein the substituted $C_1$-$C_{60}$ alkyl group refers to the unsubstituted $C_1$-$C_{60}$ alkyl group in which at least one hydrogen atom is substituted with a deuterium; —F; —Cl; —Br; —I; —CN; a hydroxyl group; —NO$_2$; an amino group; an amidino group; a hydrazine group; a hydrazone group; a carboxyl group or a salt thereof; a sulfonic acid group or a salt thereof; a phosphoric acid or a salt thereof; tri($C_6$-$C_{60}$ aryl)silyl;

a $C_1$-$C_{60}$ alkyl group, a $C_1$-$C_{60}$ alkoxy group, a $C_2$-$C_{60}$ alkenyl group, and a $C_2$-$C_{60}$ alkynyl group;

a $C_1$-$C_{60}$ alkyl group, a $C_1$-$C_{60}$ alkoxy group, a $C_2$-$C_{60}$ alkenyl group, and a $C_2$-$C_{60}$ alkynyl group, each substituted with at least one of a deuterium, —F, —Cl, —Br, —I, —CN, a hydroxyl group, —NO$_2$, an amino group, an amidino group, a hydrazine group, a hydrazone group, a carboxyl group or a salt thereof, a sulfonic acid group or a salt thereof, and a phosphoric acid or a salt thereof;

a $C_3$-$C_{60}$ cycloalkyl group, a $C_3$-$C_{60}$ cycloalkenyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group; and a $C_3$-$C_{60}$ cycloalkyl group, a $C_3$-$C_{60}$ cycloalkenyl group, a $C_6$-$C_{60}$ aryl group, a $C_2$-$C_{60}$ heteroaryl group, a $C_6$-$C_{60}$ aralkyl group, a $C_6$-$C_{60}$ aryloxy group, and a $C_6$-$C_{60}$ arylthio group, each substituted with a deuterium, —F, —Cl, —Br, —I, —CN, a hydroxyl group, —NO$_2$, an amino group, an amidino group, a hydrazine group, a hydrazone group, a carboxyl group or a salt thereof, a sulfonic acid group or a salt thereof, a phosphoric acid or a salt thereof, $C_1$-$C_{60}$ alkyl group, and a $C_1$-$C_{60}$ alkyl group, a $C_1$-$C_{60}$ alkoxy group, a $C_2$-$C_{60}$ alkenyl group, a $C_2$-$C_{60}$ alkynyl group, a $C_6$-$C_{60}$ aryl group, and a $C_2$-$C_{60}$ heteroaryl group, each substituted with at least one F.

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are methoxy, ethoxy, and isopropyloxy, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon-carbon double bonds at a center or end thereof. Examples of the unsubstituted $C_2$-$C_{60}$ alkenyl group are ethenyl, propenyl, and butenyl. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon-carbon triple bonds at a center or end thereof. Examples of the unsubstituted $C_2$-$C_{60}$ alkynyl group are ethynyl, propynyl, and the like. At least one hydrogen atom of these alkynyl groups may be substituted with the same substituent as described above in connection with the substituted $C_1$-$C_{60}$ alkyl group.

The unsubstituted $C_3$-$C_{60}$ cycloaryl group is a monovalent saturated cyclic hydrocarbon group having 3 to 60 carbon atoms, and detailed examples thereof include a cyclopropyl, a cyclobutyl, a cyclopentyl, a cyclohexyl, a cyclooctyl, or the like. At least one hydrogen atom of the unsubstituted $C_3$-$C_{60}$ cycloaryl group may be substituted with the same substituent as described above in connection with the substituted $C_1$-$C_{60}$ alkyl group.

The unsubstituted $C_3$-$C_{60}$ cycloalkenyl group refers to a ring-type unsaturated hydrocarbon group that has at least one carbon-carbon double bond, but that is not an aromatic ring, wherein examples thereof include a cyclopropenyl, a cyclobutenyl, a cyclopentenyl, a cyclohexenyl, a cycloheptenyl, a 1,3-cyclohexadienyl group, a 1,4-cyclohexadienyl group, a 2,4-cycloheptadienyl group, and a 1,5-cyclooctadienyl group. At least one hydrogen atom of the cycloalkenyl group may be substituted with the same substituent as described above in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group include two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, a azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one heteroatom selected from nitrogen (N), oxygen (O), phosphorous (P), and sulfur (S) and carbon atoms as the remaining ring atoms. The unsubstituted $C_2$-$C_{60}$ heteroarylene group used herein refers to a divalent group having a system composed of one or more aromatic rings having at least one heteroatom selected from nitrogen (N), oxygen (O), phosphorous (P), and sulfur (S) and carbon atoms as the remaining ring atoms. In this regard, when the unsubstituted $C_2$-$C_{60}$ heteroaryl group and the unsubstituted $C_2$-$C_{60}$ heteroarylene group each include two or more rings, the rings may be fused to each other. At least one hydrogen atom of the unsubstituted $C_2$-$C_{60}$ heteroaryl group and the unsubstituted $C_2$-$C_{60}$ heteroarylene group may be substituted with the same substituent described in connection with the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl, an oxadiazolyl group, a pyridinyl group, a pyridazinyl group, a pyrimidinyl group, a triazinyl group, a carbazolyl group, an iodolyl group, a quinolinyl group, an isoquinolinyl group, a benzimidazolyl group, an imidazopyridinyl group, and an imidazopyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates —$OA_2$ (where $A_2$ is the substituted or unsubstituted $C_6$-$C_{60}$ aryl group), and the substituted or unsubstituted $C_6$-$C_{60}$ arylthio group indicates —$SA_3$ (where $A_3$ is the substituted or unsubstituted $C_6$-$C_{60}$ aryl group).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1: Synthesis of Compound 1

Synthesis of Intermediate 1(1)

Intermediate 1(1) was synthesized according to Reaction Scheme 1(1) below:

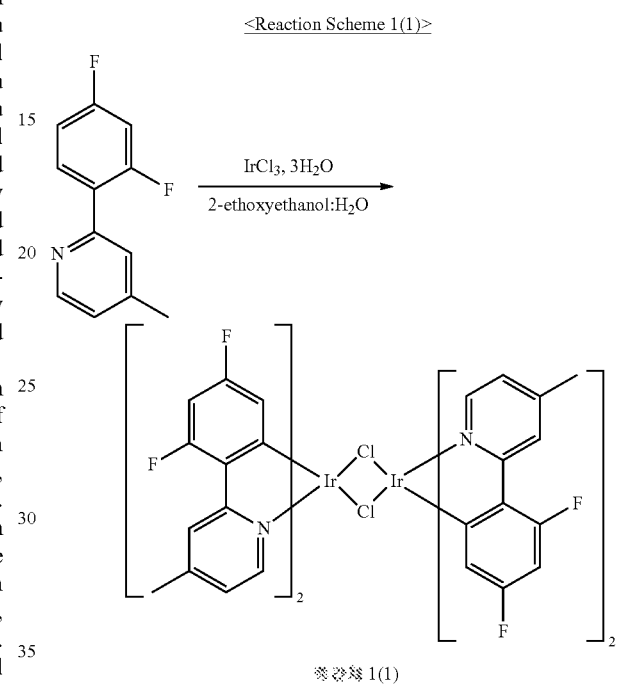

3.6 g (17.3 mmol) of 2-(2,4-difluorophenyl)-4-methyl-pyridine was dissolved in 45 mL of 2-ethoxy ethanol and then 2.4 g (7.6 mmol) of iridium chloride hydrate and 15 mL of distilled water were added thereto, which was then stirred at a temperature of 130° C. for 20 hours to prepare a reaction solution. After the completion of the reaction, the reaction solution was cooled to room or ambient temperature and a precipitate was filtered therefrom, which was washed with methanol and then dried in a vacuum atmosphere to obtain Intermediate 1(1) (4.3 g, 60% yield).

Synthesis of Compound 1

Compound 1 was synthesized according to Reaction Scheme 1(2) below:

-continued

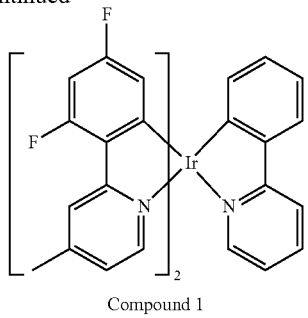

Compound 1

1.0 g (1.03 mmol) of Intermediate 1(1), 0.38 g (2.44 mmol) of phenyl pyridine, and 0.34 g (2.46 mmol) of $K_2CO_3$ were added to 30 mL of 2-ethoxy ethanol and then stirred at a temperature of 130° C. for 12 hours to prepare a reaction solution. After the completion of the reaction, the reaction solution was cooled to ambient temperature and a precipitate was filtered therefrom, which was then washed with methanol. The precipitate obtained therefrom was dissolved by using dichloromethane, a product obtained therefrom was filtered by using a silica short pad, a dichloromethane solution, filtered therefrom was boiled again, and methanol was gradually added thereto to precipitate and obtain Compound 1 (0.60 g, 53% yield).

$^1$H NMR: 8.56 (3H), 8.30 (1H), 7.97 (3H), 7.53 (4H), 7.00 (7H), 2.36 (6H). APCI-MS (m/z): 755 [M+]

Synthesis Example 2: Synthesis of Compound 2

Synthesis of Intermediate 2(1)
Intermediate 2(1) was synthesized according to Reaction Scheme 2(1):

<Reaction Scheme 2(1)>

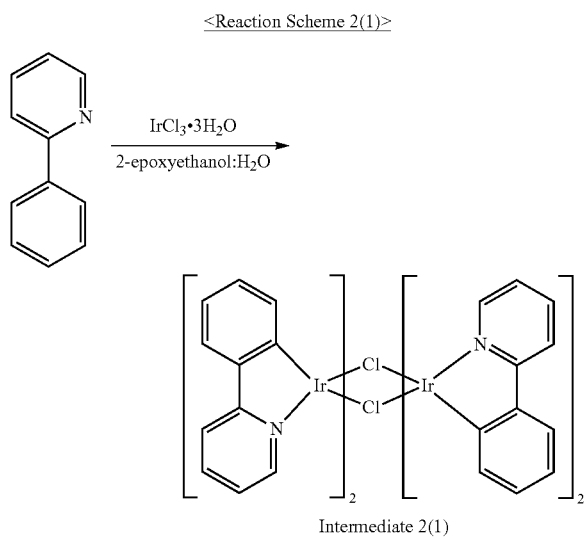

Intermediate 2(1)

2.7 g (17.3 mmol) 2-phenylpyridine was dissolved in 45 mL of 2-ethoxy ethanol, 2.4 g (7.6 mmol) of iridium chloride hydrate and 15 mL of distilled water were added thereto and then stirred at a temperature of 130° C. for 20 hours to prepare a reaction solution. After the completion of the reaction, the reaction solution was cooled to ambient temperature, a precipitate was filtered therefrom, which was then washed with methanol to wash and dry the same in a vacuum atmosphere to obtain Intermediate 2(1) (4.0 g, 60% yield).

Synthesis of Compound 2
Compound 2 was synthesized according to Reaction Scheme 2(2):

<Reaction Scheme 2(2)>

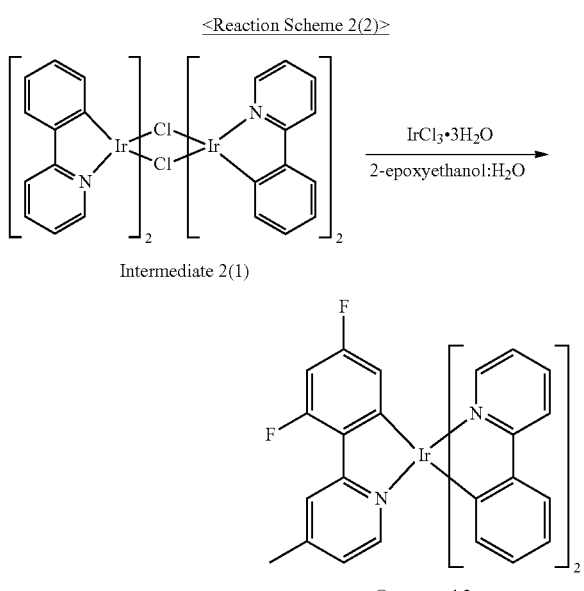

Compound 2

0.84 g (1.03 mmol) of Intermediate 2(1), 0.5 g 2.44 mmol) of 2-(2,4-difluorophenyl)-4-methylpyridine(2-(2,4-difluorophenyl)-4-methylpyridine), and 0.34 g (2.46 mmol) of $K_2CO_3$ were added to 30 mL of 2-ethoxy ethanol and then stirred at a temperature of 130° C. for 12 hours to prepare a reaction solution. After the completion of the reaction, the reaction solution was cooled to ambient temperature, and a precipitate was filtered therefrom and then washed with methanol. The precipitate obtained therefrom was dissolved by using dichloromethane, a product obtained therefrom was filtered by using a silica short pad, a dichloromethane solution filtered therefrom was boiled again, and methanol was gradually added thereto to precipitate and obtain Compound 2 (0.57 g, 50% yield).

$^1$H-NMR: 8.57 (3H), 8.29 (3H), 7.80 (3H), 7.54 (8H), 6.98 (5H), 2.36 (6H). APCI-MS (m/z): 705 [M+]

Synthesis Example 3: Synthesis of Compound 32

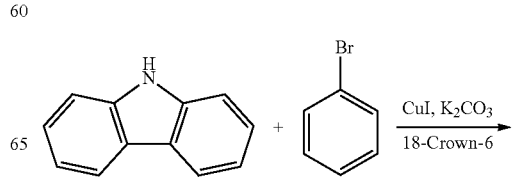

-continued

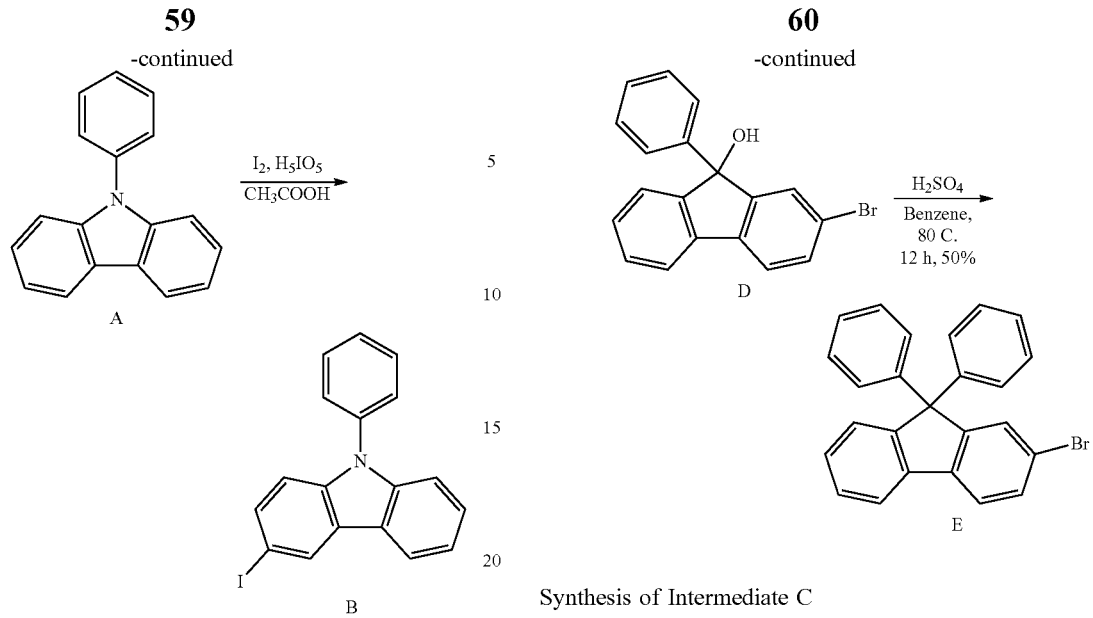

Synthesis of Intermediate A 3.344 g (20 mmol) of carbazole was added to 40 mL of DMPU, and 0.761 g (4 mmol) of CuI, 11.057 g (80 mmol) of K$_2$CO$_3$, and 0.1 g (4 mmol) of 18-crown-6 were added thereto to prepare a mixture. The mixture was stirred at a temperature of 170° C. for 20 hours, cooled to ambient temperature, and then a solvent was removed through vacuum distillation to obtain a product. 100 mL of dichloromethane was added to the product obtained therefrom to dissolve the same and then washed several times with water to obtain a washed dichloromethane layer. The washed dichloromethane layer was dried with magnesium sulfate and then dried by reduced pressure to obtain a crude product. The erode product was separated and purified by using a silica gel column chromatography and then recrystallized with hexane to obtain 3.28 g (yield 67%) of a solid form Intermediate A.

Synthesis of Intermediate B 2.433 g (10 mmol) of Intermediate A was added to 100 mL of 80% acetic acid, 1.357 g (5.35 mmol) of iodine (I$_2$) and 0.333 g (1.46 mmol) of ortho-periodic acid (H$_5$IO$_6$) were added thereto and then stirred in nitrogen atmosphere at a temperature of 80° C. for 2 hours to obtain a reaction solution. After the completion of the reaction, the reaction solution was extracted three times with 50 mL of ethyl ether to collect organic layers, and the collected organic layers were dried with magnesium sulfate and then reduced pressure filtered to obtain a crude product. The crude product was separated and purified by using a silica gel column chromatography to obtain 3.23 g (yield 87%) of Intermediate B.

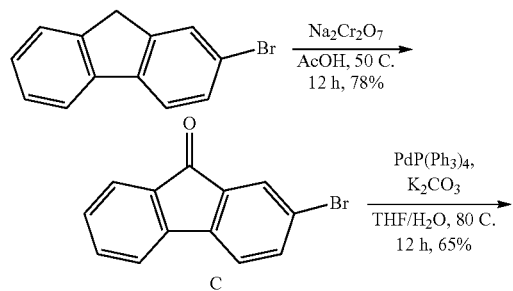

Synthesis of Intermediate C 13 g (53 mmol) of 2-bromofluorene was dissolved in 60 mL of acetic acid and 60 g (200 mmol) of sodium dichromate was added slowly thereto at a temperature of 0° C. to obtain a mixture. After stirring the mixture for 12 hours, 200 mL of distilled water was added thereto and then sufficiently stirred to obtain a yellow solid. The yellow solid obtained therefrom was filtered and then dried to obtain 10 g (yield 78%) of Intermediate C.

Synthesis of Intermediate D 8 g (31.6 mmol) of Intermediate C was dissolved in 60 mL of THF, 38 mL (38 mmol) of 1M phenyl magnesium bromide was slowly added thereto at a temperature of −78° C. and then stirred for next two hours to obtain a mixture. The mixture was stirred again at ambient temperature for 5 hours. 50 mL of ammonium chloride aqueous solution was added to the mixture and then extracted three times with 40 mL of ethyl acetate to collect organic layers. The collected organic layers were dried with magnesium sulfate and a solvent was evaporated therefore to obtain a crude product, which was separated and purified by using a silica gel column chromatography to obtain 10 g (yield 95%) of Intermediate D. A structure of Intermediate D was identified through $^1$H-NMR.

$^1$H-NMR (CDCl3, 400 MHz) δ (ppm) 7.64 (d, 1H), 7.54-7.47 (m, 2H), 7.44 (d, 1H), 7.39-7.33 (m, 3H), 7.30-7.23 (m, 5H), 2.46 (s, 1H)

Synthesis of Intermediate E 10 g (30 mmol) of Intermediate D was dissolved in 60 mL of benzene and 2.4 mL (45 mmol) of concentrated sulfuric acid was diluted in a small amount of benzene and then added to prepare a mixture. The mixture was stirred at a temperature of 80° C. for 5 hours, benzene was evaporated therefrom and 1 N sodium hydroxide aqueous solution was added to a residual solution to adjust pH to 7, and then extracted three times with 40 mL ethyl acetate to collect organic layers. The collected organic layers were dried with magnesium sulfate and a solvent was evaporated therefrom to obtain a crude product, which was separated and filtered by using a silica gel column chromatography to obtain 6 g (yield 50%) of Intermediate E.

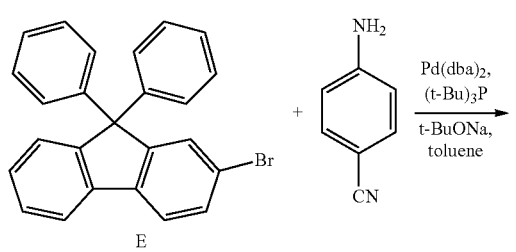

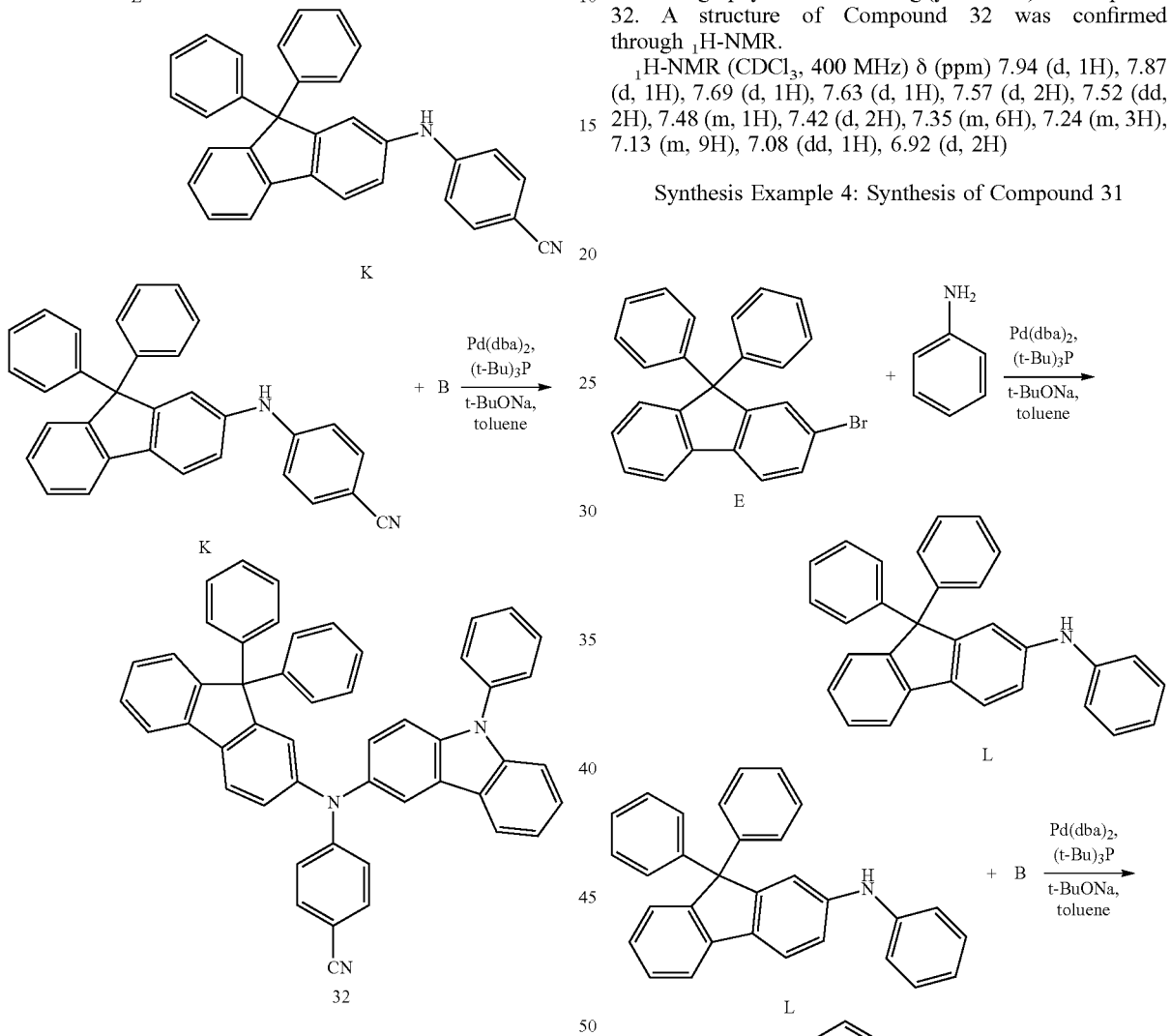

toluene, and then 0.144 g (1.5 mmol) of t-BuONa, 0.018 g (0.02 mmol) of Pd(dba)₂, and 0.004~0.006 g (0.02~0.03 mmol) of (t-Bu)₃P were added thereto and then stirred at a temperature of 90° C. for 6 hours to obtain a reaction mixture. The reaction mixture was extracted three times with 30 mL of ethyl ether to collect organic layers. The collected organic layers were dried with magnesium sulfate and a solvent was evaporated therefrom to obtain a residue, which was separated and purified by using a silica gel column chromatography to obtain 0.236 g (yield 57%) of Compound 32. A structure of Compound 32 was confirmed through ₁H-NMR.

₁H-NMR (CDCl₃, 400 MHz) δ (ppm) 7.94 (d, 1H), 7.87 (d, 1H), 7.69 (d, 1H), 7.63 (d, 1H), 7.57 (d, 2H), 7.52 (dd, 2H), 7.48 (m, 1H), 7.42 (d, 2H), 7.35 (m, 6H), 7.24 (m, 3H), 7.13 (m, 9H), 7.08 (dd, 1H), 6.92 (d, 2H)

Synthesis Example 4: Synthesis of Compound 31

Synthesis of Intermediate K 340 mg (8.56 mmol) of Intermediate E and 142 mg (1.2 mmol) of 4-aminobenzonitrile were dissolved in 5 mL of toluene, 0.144 g (1.5 mmol) of t-BuONa, 0.018 g (0.02 mmol) of Pd(dba)₂, and 0.004~0.006 g (0.02~0.03 mmol) of (t-Bu)₃P were added thereto and then stirred at a temperature of 80° C. for 5 hours to obtain a reaction solution. The reaction solution was extracted three times with 20 mL of ethyl ether to collect organic layers. The collected organic layers were dried with magnesium sulfate and a solvent was evaporated therefrom to obtain a residue, which was separated and purified by using a silica gel column chromatography to obtain 0.27 g (yield 73%) of Intermediate K.

Synthesis of Compound 32

267 mg (0.614 mmol) of Intermediate K and 0.332 g (0.9 mmol) of Intermediate B were dissolved in 10 mL of Synthesis of Intermediate L The same synthesis method for Intermediate K was used to obtain 0.30 g (yield 79%) of Intermediate L, except that 142 mg (1.2 mmol) of phenylamine was used instead of 4-aminobenzonitrile.

Synthesis of Compound 31

The same synthesis method for Compound 32 was used to obtain 0.236 g (yield 57%) of Compound 31, except that 267 mg (0.614 mmol) of Intermediate L was used instead of Intermediate K. A structure of Compound 31 was identified through $_1$H-NMR.

1H-NMR (CDCl$_3$, 400 MHz) δ (ppm) 7.97 (d, 1H), 7.90 (d, 1H), 7.69 (d, 1H), 7.65 (d, 1H), 7.60 (d, 2H), 7.56 (dd, 2H), 7.48 (m, 1H), 7.40 (d, 2H), 7.35 (m, 6H), 7.24 (m, 3H), 7.16 (m, 10H), 7.11 (dd, 1H), 6.93 (d, 2H)

Synthesis Example 5: Synthesis of Compound 33

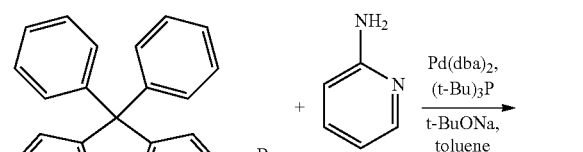

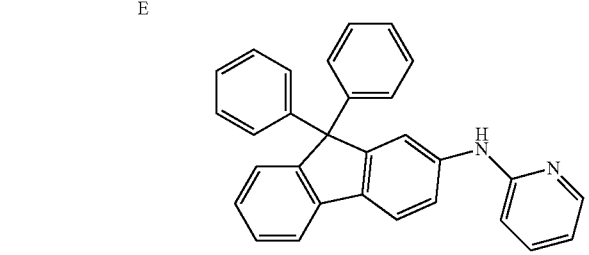

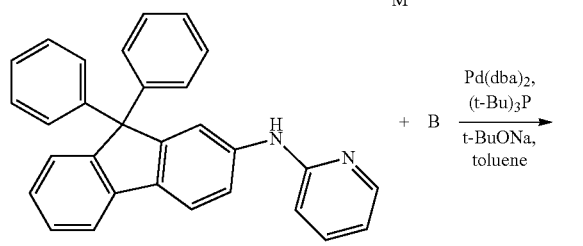

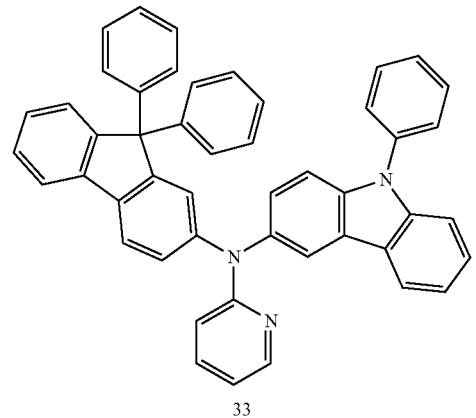

Synthesis of Intermediate M

The same synthesis method for Intermediate K was used to obtain 0.32 g (yield 82%) of Intermediate M, except that 142 mg (1.2 mmol) of pyridine-2-yl amine was used instead of 4-aminobenzonitrile.

Synthesis of Compound 33

The same synthesis method for Compound 32 was used to obtain 0.236 g (yield 57%) of Compound 33, except that 267 mg (0.614 mmol) of Intermediate M was used instead of Intermediate K. A structure of Compound 33 was identified through $_1$H-NMR.

$^1$-NMR (CDCl$_3$, 400 MHz) δ (ppm) 7.91 (d, 1H), 7.83 (d, 1H), 7.69 (d, 1H), 7.62 (d, 1H), 7.60 (d, 2H), 7.53 (dd, 2H), 7.49 (m, 1H), 7.40 (d, 2H), 7.35 (m, 6H), 7.21 (m, 2H), 7.17 (m, 10H), 7.13 (dd, 1H), 6.90 (d, 2H)

Example 1

An anode was prepared by cutting a Corning 15 Ωcm$^2$ (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes and exposing to ozone to clean. Then, the anode was loaded into a vacuum deposition apparatus.

2-TNATA was deposited on the ITO glass substrate to form an HIL having a thickness of 600 Å, and then, Compound 31 was deposited on the HIL to form an HTL having a thickness of 300 Å. Subsequently, CBP as a host and Compound 1 as a blue phosphorescent dopant were vacuum-deposited on the HTL at a weight ratio of 95:5 to form an EML having a thickness of 200 Å. Compound 201 was deposited on the EML to form an EIL having a thickness of 300 Å and LiF was deposited on the ETL to form an EIL having a thickness of 10 Å, and Al was deposited on the EIL to form a second electrode (cathode) having a thickness of 3,000 Å to manufacture an organic light-emitting device.

Example 2

An organic light-emitting device was manufactured in the same manner as in Example 1, except that Compound 32 was used instead of Compound 31 when forming an HTL.

Example 3

An organic light-emitting device was manufactured in the same manner as in Example 1, except that Compound 33 was used instead of Compound 31 when forming an HTL.

Example 4

An organic light-emitting device was manufactured in the same manner as in Example 1, except that Compound 2 was used instead of Compound 1 when forming as EML.

Example 5

An organic light-emitting device was manufactured in the same manner as in Example 1, except that Compound 32 was used instead of Compound 31 when forming an HTL and Compound 2 was used instead of Compound 1 when forming an EML.

Example 6

An organic light-emitting device was manufactured in the same manner as in Example 1, except that Compound 33 was used instead of Compound 31 when forming an HTL and Compound 2 was used instead of Compound 1 when forming an EML.

Comparative Example 1

An organic light-emitting device was manufactured in the same manner as in Example 1, except that TPD was used instead of Compound 31 when forming an HTL.

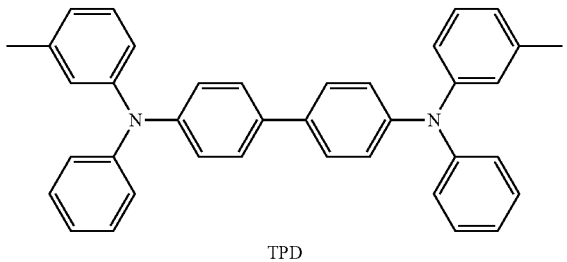

TPD

Comparative Example 2

An organic light-emitting device was manufactured in the same manner as in Example 1, except that NPB was used instead of Compound 31 when forming an HTL.

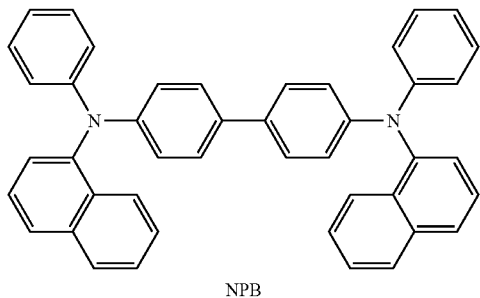

NPB

Comparative Example 3

An organic light-emitting device was manufactured in the same manner as in Example 1, except that F$_2$Irpic used instead of Compound 1 when forming an EML.

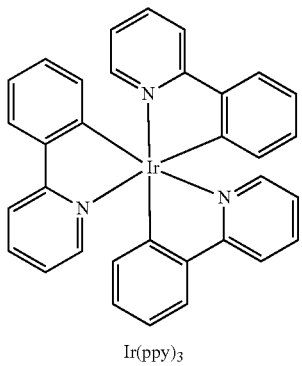

Ir(ppy)$_3$

Comparative Example 4

An organic light-emitting device was manufactured in the same manner as in Example 1, except that Compound A was used instead of Compound 31 when forming an HTL and DPVBi was used instead of Compound 1 when forming an EML.

<Compound A>

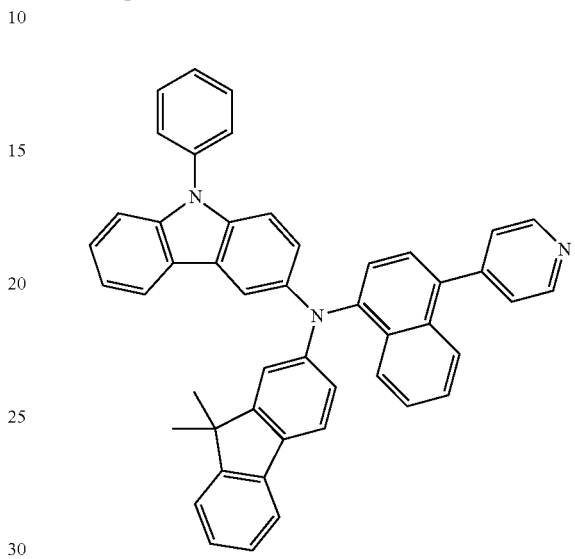

Comparative Example 5

An organic light-emitting device was manufactured in the same manner as in Example 1, except that Compound B was used instead of Compound 31 when forming an HTL and DPVBi was used instead of Compound 1 when forming an EML.

<Compound B>

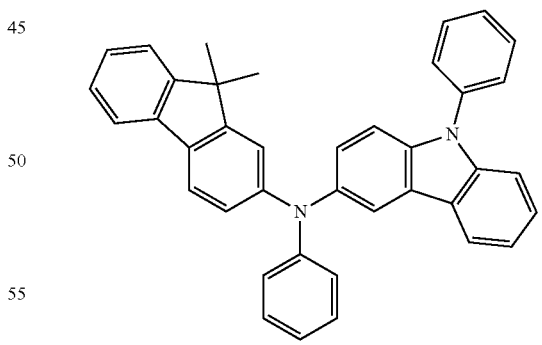

Comparative Example 6

An organic light-emitting device was manufactured in the same manner as in Example 1, except that NPB was used instead of Compound 31 when forming an HTL and Compound C was used instead of Compound 1 when forming an EML.

<Compound C>

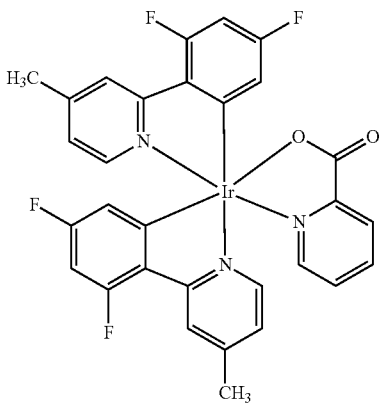

Evaluation Example

Driving voltages, brightness, and efficiencies (at a current density of 10 mA/cm$^2$) of the organic light-emitting devices of Examples 1 to 6 and Comparative Examples 1 to 6 were evaluated by using a PR650 Spectroscan source measurement unit (a product of PhotoResearch). The results obtained therefrom are as shown in Table 1.

TABLE 1

| | HTL | Dopant | Driving voltage (V) | Brightness (cd/m$^2$) | Efficiency (cd/A) |
|---|---|---|---|---|---|
| Example 1 | Compound 31 | Compound 1 | 5.2 | 4850 | 49.2 |
| Example 2 | Compound 32 | Compound 1 | 5.3 | 4920 | 50.3 |
| Example 3 | Compound 33 | Compound 1 | 5.4 | 4790 | 51.2 |
| Example 4 | Compound 31 | Compound 2 | 5.1 | 4700 | 48.6 |
| Example 5 | Compound 32 | Compound 2 | 5.3 | 4870 | 48.0 |
| Example 6 | Compound 33 | Compound 2 | 5.2 | 4690 | 48.7 |
| Comparative Example 1 | TPD | Compound 1 | 5.9 | 3980 | 41.0 |
| Comparative Example 2 | NPB | Compound 1 | 6.0 | 3970 | 40.7 |
| Comparative Example 3 | Compound 31 | F$_2$Irpic | 6.2 | 3840 | 41.2 |
| Comparative Example 4 | Compound A | DPVBi | 5.6 | 4180 | 42.9 |
| Comparative Example 5 | Compound B | DPVBi | 5.9 | 4330 | 38.9 |
| Comparative Example 6 | NPB | Compound C | 5.7 | 4060 | 41.5 |

Referring to Table 1, the organic light-emitting devices of Examples 1 to 6 exhibited lower driving voltages than the organic light-emitting devices of Comparative Examples 1 to 6, and the organic light-emitting devices of Examples 1 to 6 showed excellent I-V-L characteristics with improved efficiencies.

As described above, the embodiments may provide an organic light-emitting device having high efficiency and high color purity.

The embodiments may provide a high definition organic light-emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a second electrode opposite to the first electrode;
an emission layer between the first electrode and the second electrode; and
a hole transport region between the first electrode and the emission layer,
wherein the emission layer includes at least one organometallic compound represented by Formula 1; and
wherein the hole transport region includes at least one carbazole-based compound, the carbazole-based compound being one of Compounds 21 to 42;

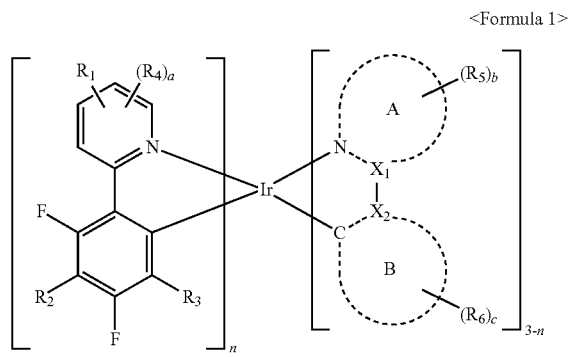

<Formula 1>

In Formula 1,
R$_1$ is selected from a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_3$-C$_{10}$ cycloalkenyl group, a substituted or unsubstituted C$_3$-C$_{10}$ heterocycloalkyl group, a substituted or unsubstituted C$_3$-C$_{10}$ heterocycloalkenyl group, a substituted or unsubstituted C$_6$-C$_{30}$ aryl group, a substituted or unsubstituted C$_6$-C$_{30}$ aryloxy group, a substituted or unsubstituted C$_6$-C$_{30}$ arylthio group, a substituted or unsubstituted C$_2$-C$_{30}$ heteroaryl group, —N(Q$_1$)(Q$_2$), —C(=O)(Q$_3$), and —Si(Q$_4$)(Q$_5$)(Q$_6$), in which Q$_1$ to Q$_6$ are each independently a hydrogen, a substituted or unsubstituted C$_1$-C$_{60}$ alkyl group, a substituted or unsubstituted C$_6$-C$_{30}$ aryl group, or a substituted or unsubstituted C$_2$-C$_{30}$ heteroaryl group:
R$_2$ to R$_6$ are each independently selected from a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, $-N(Q_1)(Q_2)$, $-C(=O)(Q_3)$, and $-Si(Q_4)(Q_5)(Q_6)$, in which $Q_1$ to $Q_6$ are each independently a hydrogen, a substituted or unsubstituted $C_1$-$C_{60}$ alkyl group, a substituted or unsubstituted $C_1$-$C_{60}$ alkoxy group, a substituted or unsubstituted $C_6$-$C_{30}$ aryl group, or a substituted or unsubstituted $C_2$-$C_{30}$ heteroaryl group;

a is an integer of 1 to 3, and when a is 2 or greater, two or more $R_4$s are the same or different;

b and c are each independently integers of 1 to 6, when b is 2 or greater, two or more $R_5$s are the same or different, and when c is 2 or greater, two or more $R_6$s are the same or different;

A forms a ring structure selected from a pyrrole, an imidazole, a pyrazole, a triazole, a thiazole, an oxazole, an isothiazole, an isoxazole, a benzothiazole, a benzimidazole, a benzoxazole, a pyridine, a pyrazine, a pyrimidine, a pyridazine, an isoindole, an indole, an indazole, a purine, an isoquinoline, a quinoline, a phthalazine, a naphthyridine, a quinoxaline, a quinazoline, a cinnoline, a phenanthridine, an acridine, a phenanthroline, a phenazine, and a phenoxazine;

B forms a ring structure selected from selected from a benzene, a pentalene, an indene, a naphtalene, an azulene, a heptalene, an indacene, an acenaphthylene, a fluorene, a spiro-fluorene, a phenalene, a phenanthrene, an anthracene, a fluoranthene, a triphenylene, a pyrene, a chrysene a pyrrole, an imidazole, a pyrazole, a triazole, an isothiazole, an isoxazole, a pyridine, a pyrazine, a pyrimidine, a pyridazine, an isoindole, an indole, an indazole, a purine, an isoquinoline, a quinoline, a phthalazine, a naphthyridine, a quinoxaline, a quinazoline, a cinnoline, a phenanthridine, an acridine, a phenanthroline, a phenazine, and a phenoxazine;

$X_1$ and $X_2$ are each independently N or C;

n is 1 or 2;

21

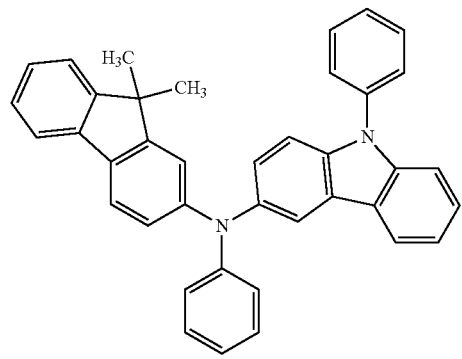

-continued

22

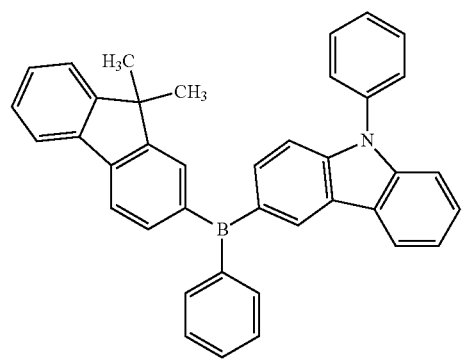

23

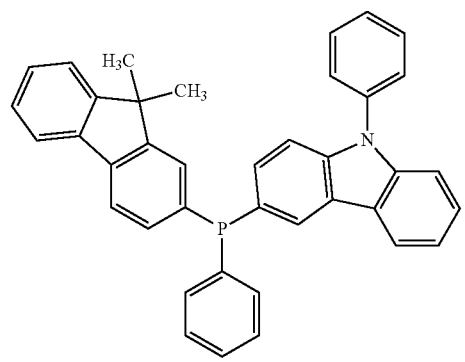

24

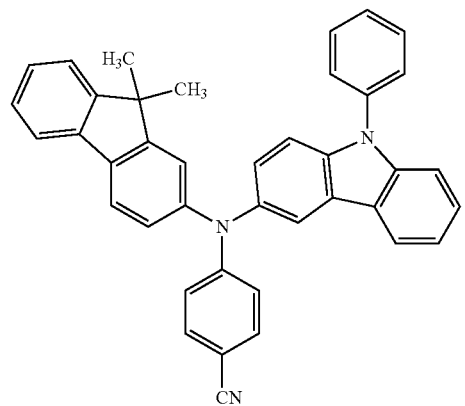

25

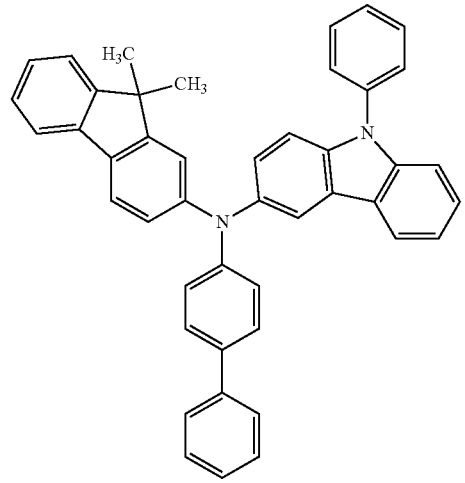

26
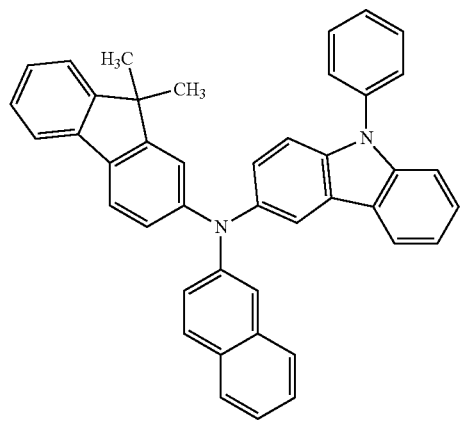
27
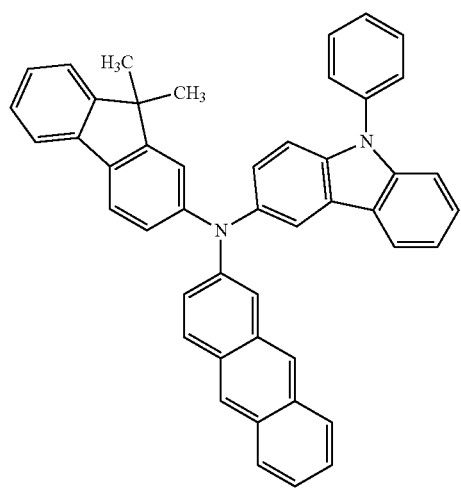
28
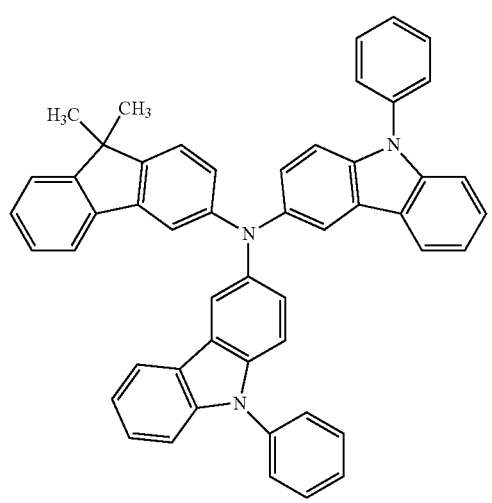
29
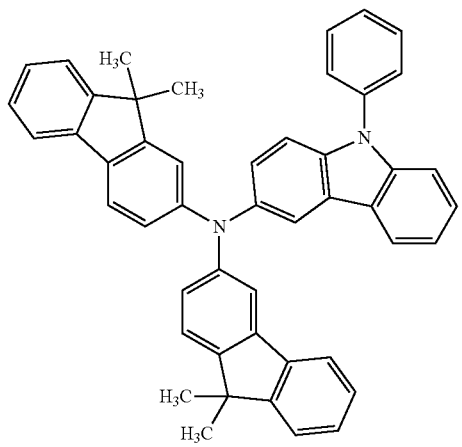
30
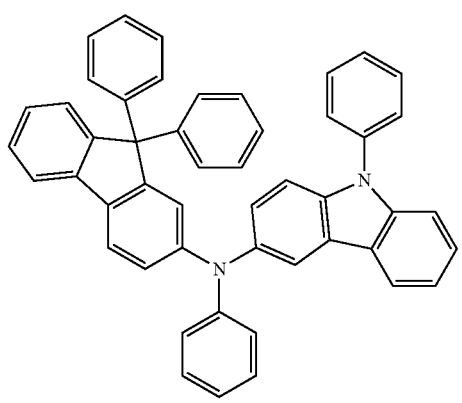
31

32
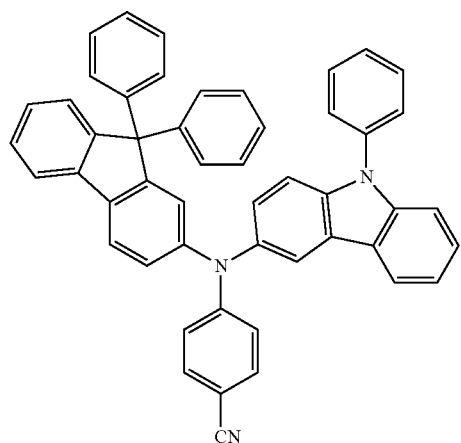
33
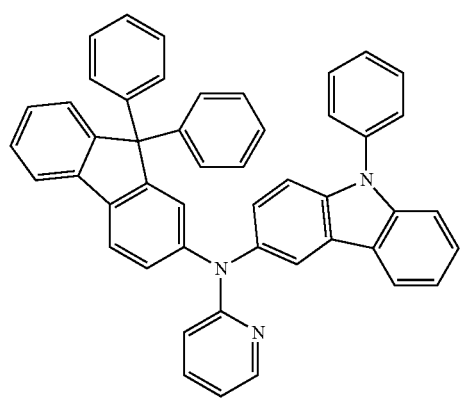
34
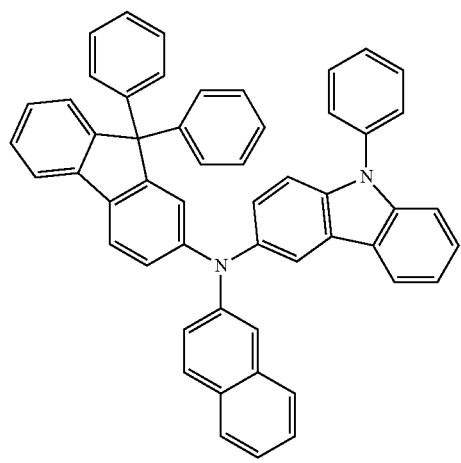
35
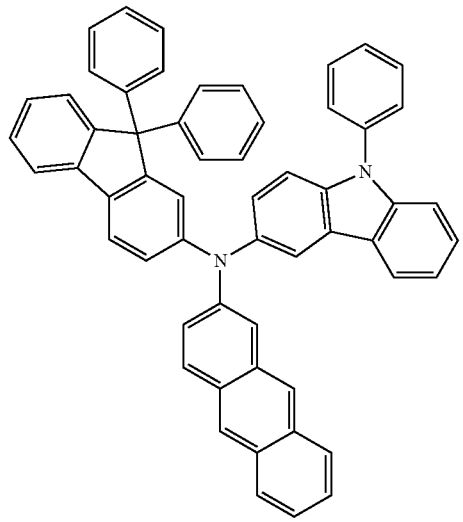
36
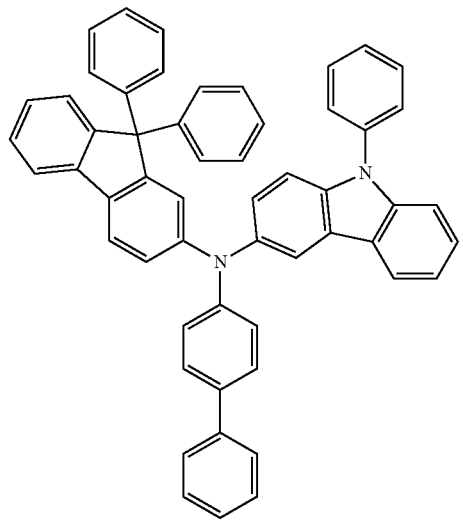
37
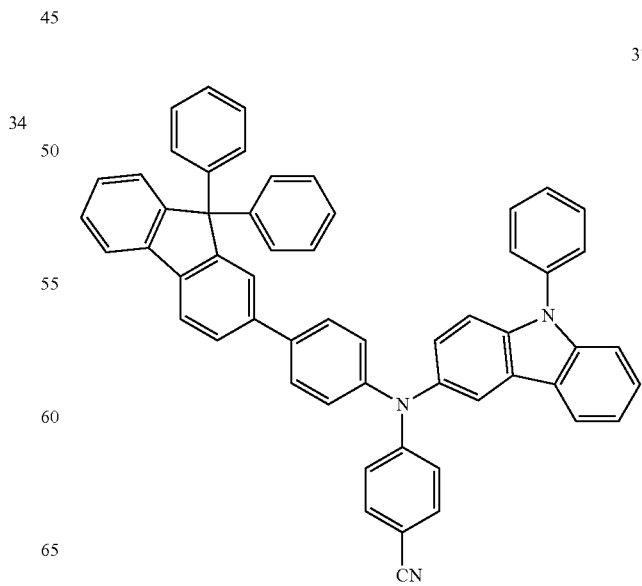

38

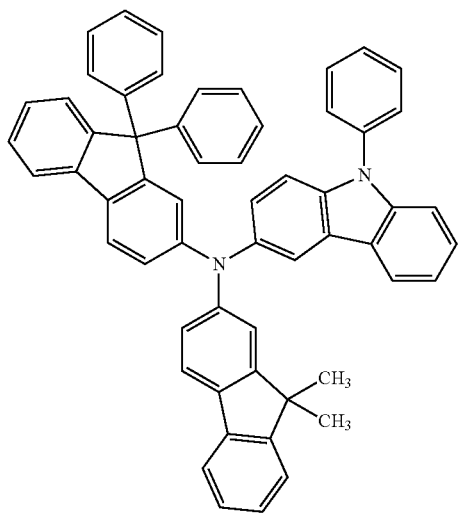

41

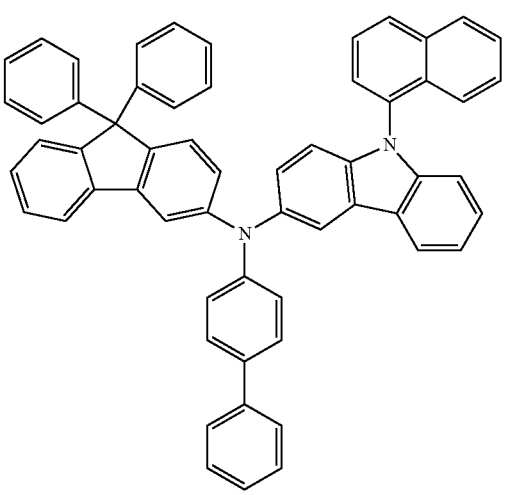

39

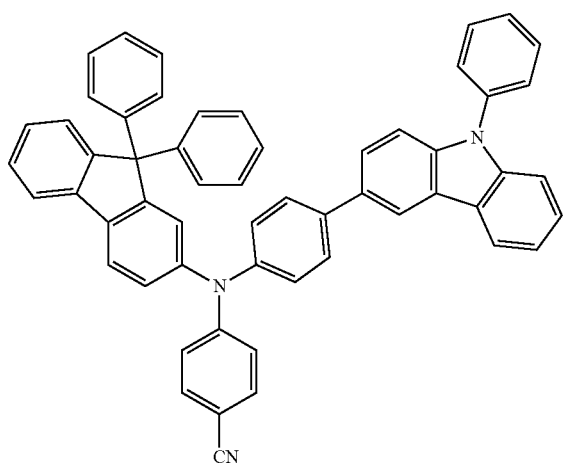

42

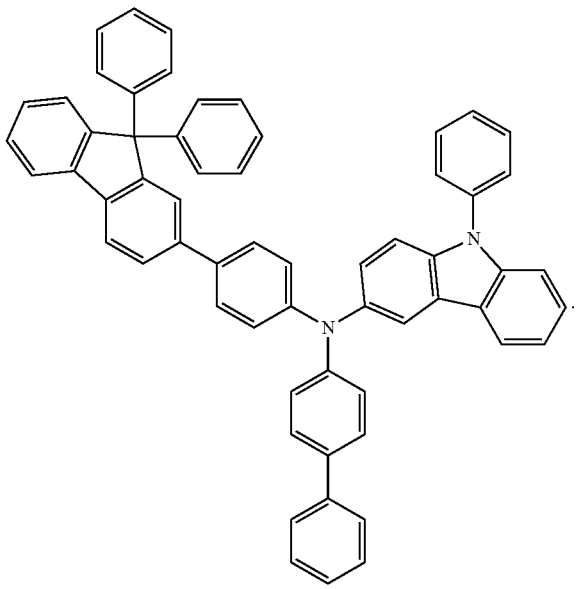

40

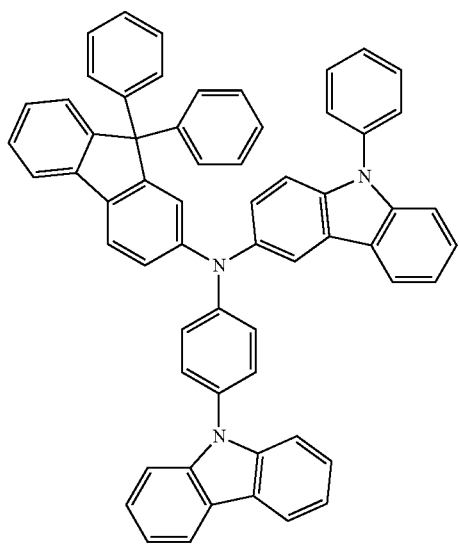

2. The organic light-emitting device as claimed in claim 1, wherein:
in Formula 1, $R_1$ is selected from:
a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;
a $C_6$-$C_{14}$ aryl group and a $C_2$-$C_{14}$ heteroaryl group;
a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group;

—N($Q_1$)($Q_2$); and —C(=O)($Q_3$); and $R_2$ to $R_6$ are each independently selected from:

a $C_1$-$C_{20}$ alkyl group and a $C_1$-$C_{20}$ alkoxy group, each substituted with at least one of a hydrogen, a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof; and a $C_6$-$C_{14}$ aryl group and a $C_2$-$C_{14}$ heteroaryl group;

a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a $C_6$-$C_{14}$ aryl group, and a $C_2$-$C_{14}$ heteroaryl group; —N($Q_1$)($Q_2$); and —C(=O)($Q_3$);

wherein $Q_1$ to $Q_3$ are each independently selected from:

a hydrogen, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid or a salt thereof;

a $C_6$-$C_{14}$ aryl group and a $C_2$-$C_{14}$ heteroaryl group; and a $C_6$-$C_{14}$ aryl group and a $C_2$-$C_{14}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group substituted with at least one —F, a $C_1$-$C_{20}$ alkyl group, a $C_1$-$C_{20}$ alkoxy group, a $C_6$-$C_{14}$ aryl group, and a $C_2$-$C_{14}$ heteroaryl group.

3. The organic light-emitting device as claimed in claim 1, wherein, in Formula 1, $R_1$ is selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, tert-decanyl group, and —N($Q_1$)($Q_2$), wherein $Q_1$ and $Q_2$ are each independently selected from:

i) a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl;

ii) a phenyl group, a naphthyl group, an anthryl group, a pyrenyl group, a phenanthrenyl group, and a fluorenyl group; and iii) a phenyl group, a naphthyl group, an anthryl group, a pyrenyl group, a phenanthrenyl group, and a fluorenyl group, each substituted with at least one of a deuterium, —F, —Cl, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group.

4. The organic light-emitting device as claimed in claim 1, wherein, in Formula 1, $R_2$ is selected from:

a hydrogen, a halogen atom, a cyano group, and a nitro group;

a $C_1$-$C_{60}$ alkyl group substituted with at least one halogen atom;

a $C_6$-$C_{30}$ aryl group and a $C_2$-$C_{30}$ heteroaryl group, each substituted with at least one halogen atom; and

—C(=O)($Q_3$), wherein $Q_3$ is selected from a $C_1$-$C_{60}$ alkyl group substituted with at least one halogen atom; and a $C_6$-$C_{30}$ aryl group and a $C_2$-$C_{30}$ heteroaryl group, each substituted with at least one of a halogen atom and a $C_1$-$C_{20}$ alkyl group substituted with at least one F.

5. The organic light-emitting device as claimed in claim 1, wherein, in Formula 1, $R_2$ is selected from:

a hydrogen, —F, —Cl, a cyano group, and a nitro group;

a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F;

a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one F; and

—C(=O)(Q₃), wherein $Q_3$ is selected from:

a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F; and a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one of F and a $C_1$-$C_{10}$ alkyl group substituted with at least one F.

6. The organic light-emitting device as claimed in claim 1, wherein, in Formula 1, $R_3$ is a hydrogen.

7. The organic light-emitting device as claimed in claim 1, wherein, in Formula 1, A forms a pyridine or a pyrazole.

8. The organic light-emitting device as claimed in claim 1, wherein in Formula 1, B forms a benzene.

9. The organic light-emitting device as claimed in claim 1, wherein the organometallic compound represented by Formula 1 is represented by Formula 1A:

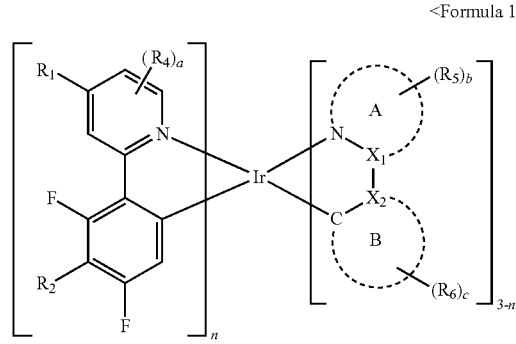

<Formula 1A> wherein, in Formula 1A, descriptions of $R_1$, $R_2$, $R_4$ to $R_6$, a, b, c, A, B, $X_1$, $X_2$, and n are the same as defined with respect to Formula 1.

10. The organic light-emitting device as claimed in claim 1, wherein the organometallic compound represented by Formula 1 includes any one of Compounds 1 to 16:

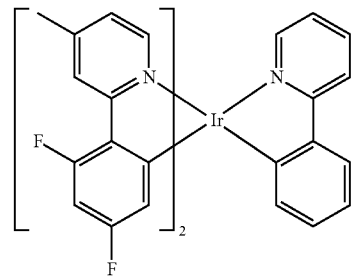

1

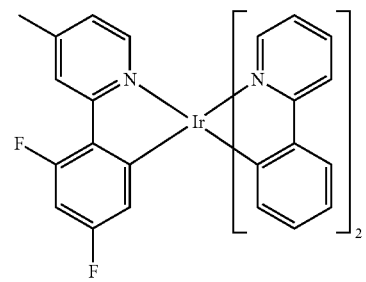

2

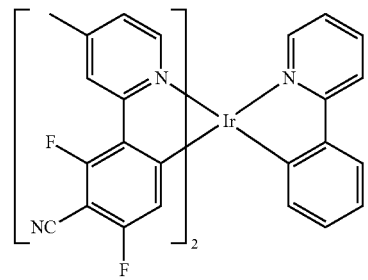

3

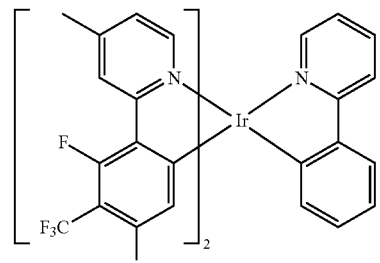

4

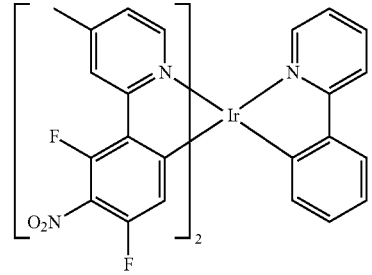

5

6
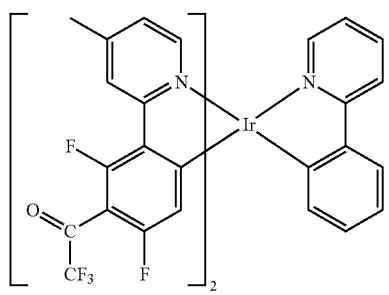
7
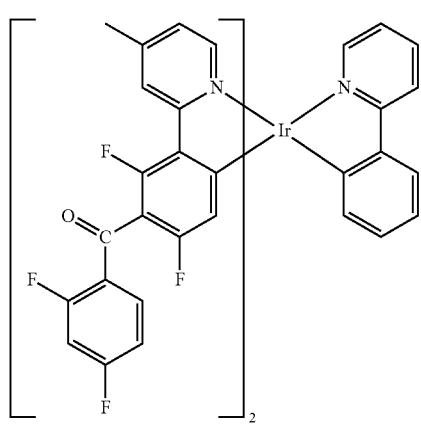
8
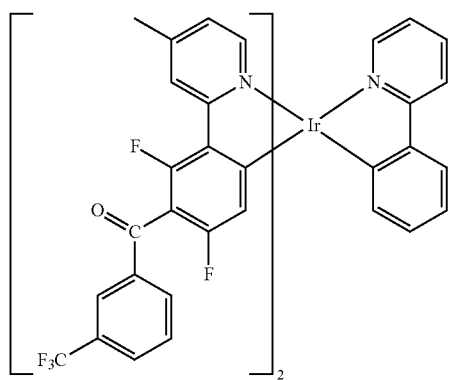
9
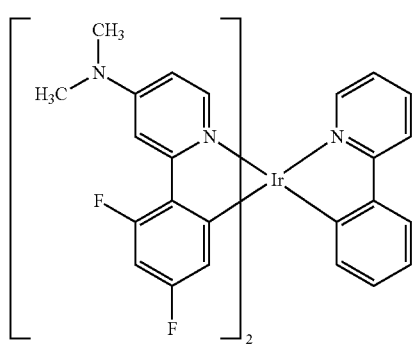
10
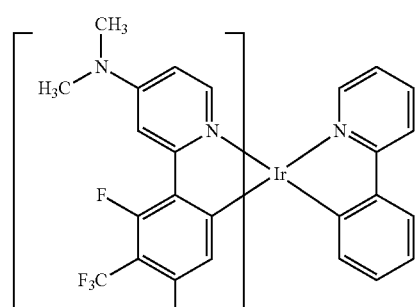
11
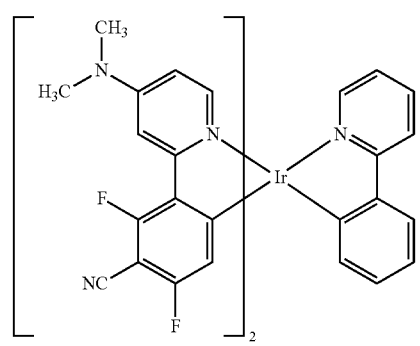
12
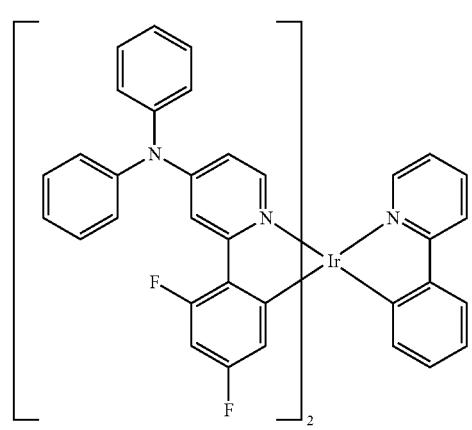
13
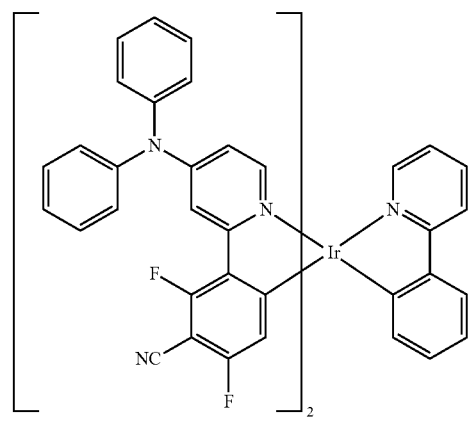

-continued

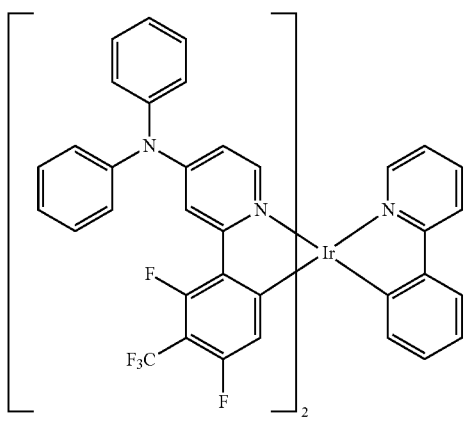

14

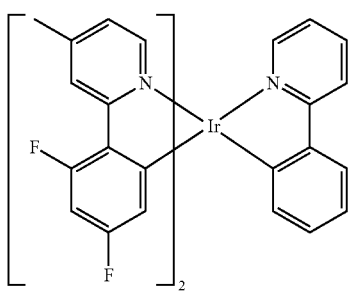

15

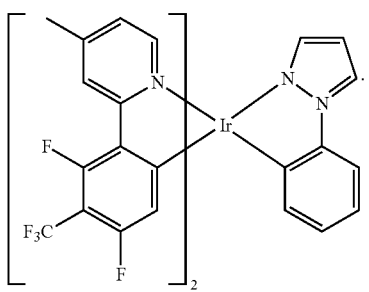

16

11. An organic light-emitting device, comprising:
a first electrode;
a second electrode opposite to the first electrode;
an emission layer between the first electrode and the second electrode; and
a hole transport region between the first electrode and the emission layer,
wherein the emission layer includes at least one organometallic compound represented by one of Formulae 1B and 1C; and
the hole transport region includes at least one carbazole-based compound represented by Formula 2A:

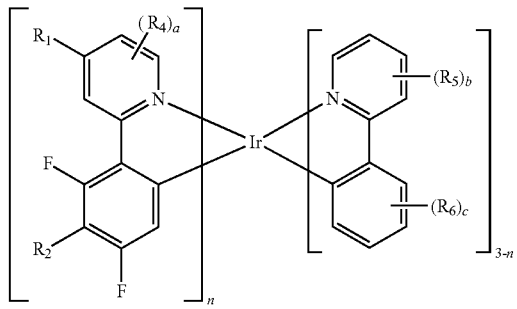
<Formula 1B>

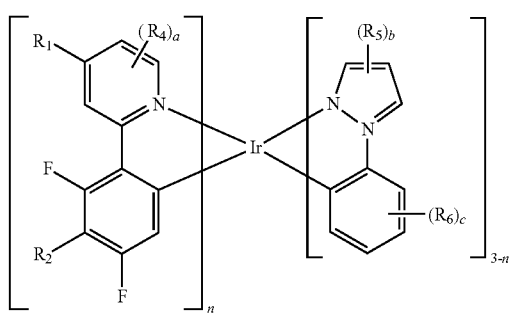
<Formula 1C>

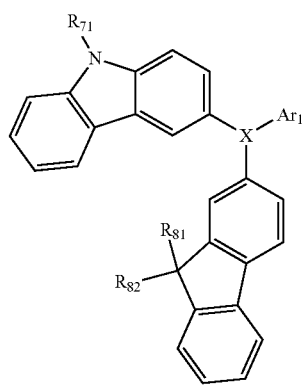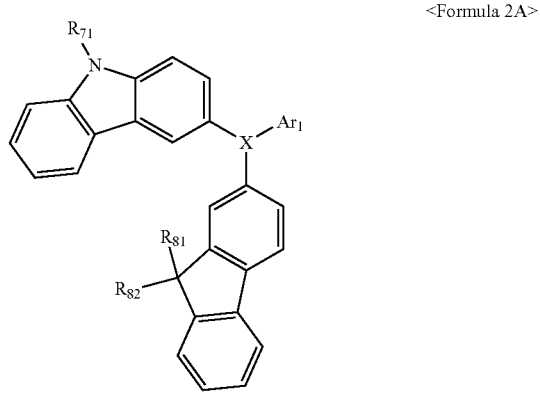
<Formula 2A> in Formulae 1B, 1C, and 2A,
$R_1$ is selected from a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl, an n-decanyl, an isodecanyl, a sec-decanyl, a tert-decanyl, and —N($Q_1$)($Q_2$),
$R_2$ is selected from:
a hydrogen, —F, —Cl, a cyano group, and a nitro group;
a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl group, an isodecanyl group, a sec-decanyl group, and a tert-decanyl group, each substituted with at least one F; and a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one F; and —C(=O)(Q$_3$), wherein Q$_1$ to Q$_3$ are each independently selected from:

a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonenyl group, an isononenyl group, a sec-nonenyl group, a tert-nonenyl group, an n-decanyl, an isodecanyl, a sec-decanyl, and a tert-decanyl, each substituted with at least one F; and a phenyl group, a naphthyl group, an anthryl group, a pyrenyl group, a phenanthrenyl group, a fluorenyl group, a pyridinyl group, a pyrazinyl group, a pyrimidinyl group, a triazinyl group, a quinolinyl group, an isoquinolinyl group, a quinoxalinyl group, a phenanthrolinyl group, and a carbazolyl group, each substituted with at least one of F and a C$_1$-C$_{20}$ alkyl group substituted with at least one F;

R$_4$ to R$_6$ are each a hydrogen, a, b, and c are each independently an integer of 1 to 3, when a is 2 or greater, two or more R$_4$s are the same or different, when b is two or greater, two or more R$_5$s are the same or different, and when c is 2 or greater, two or more R$_6$s are the same or different, n is 1 or 2;

X is a boron atom (B), a nitrogen atom (N), or a phosphorus atom (P);

R$_{71}$, R$_{81}$, and R$_{82}$ are each independently selected from a hydrogen, a deuterium, —F, a cyano group, a nitro group, a methyl group, an ethyl group, a tert-butyl group, a phenyl group, and a naphthyl group;

Ar$_1$ is selected from:

i) a phenyl group, a naphthyl group, an anthryl group, a fluorenyl group, a pyridyl group, a pyrimidyl group, a pyrazinyl group, a triazinyl group, and a carbazole group; and ii) a phenyl group, a naphthyl group, an anthryl group, a fluorenyl group, a pyridyl group, a pyrimidyl group, a pyrazinyl group, a triazinyl group, and a carbazole group, each substituted with at least one of a hydrogen, a deuterium, —F, a cyano group, a nitro group, a methyl group, an ethyl group, a tert-butyl group, a phenyl group, and a naphthyl group.

12. The organic light-emitting device as claimed in claim 11, wherein the organometallic compound represented by one of Formulae 1B and 1C includes any one of Compounds 1 to 16:

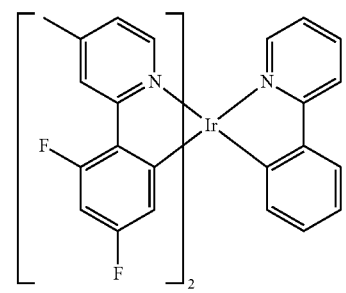

1

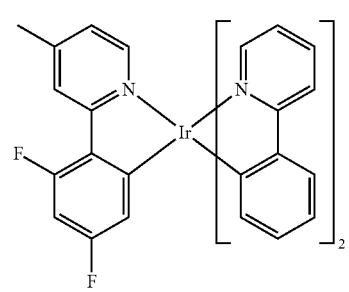

2

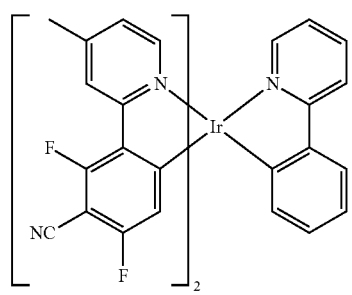

3

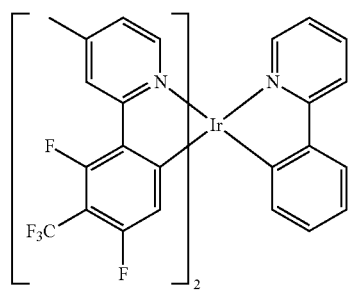

4

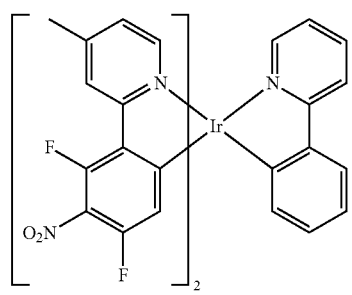

5

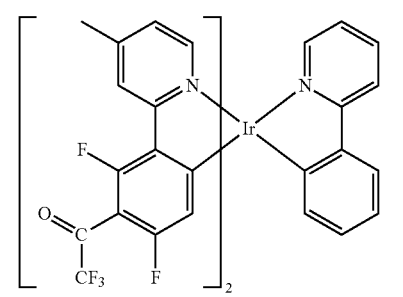
6
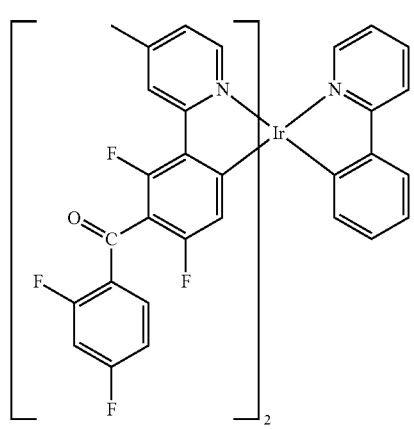
7
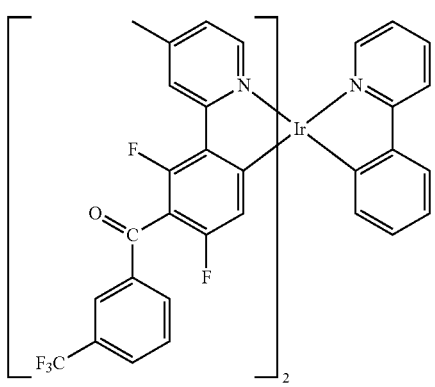
8
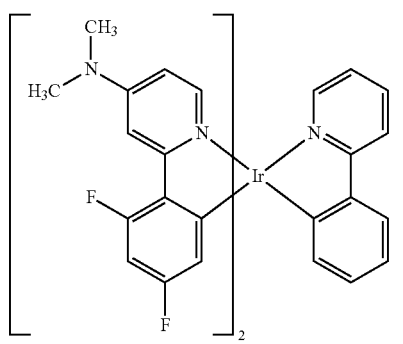
9
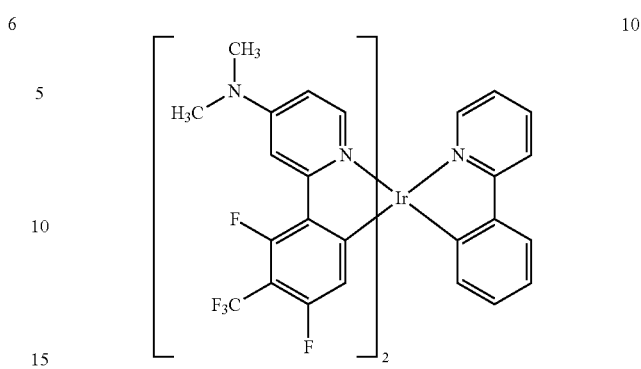
10
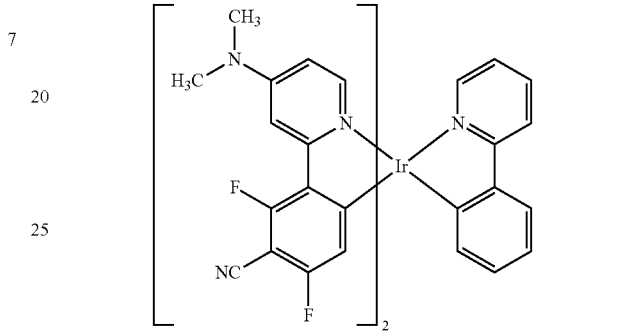
11
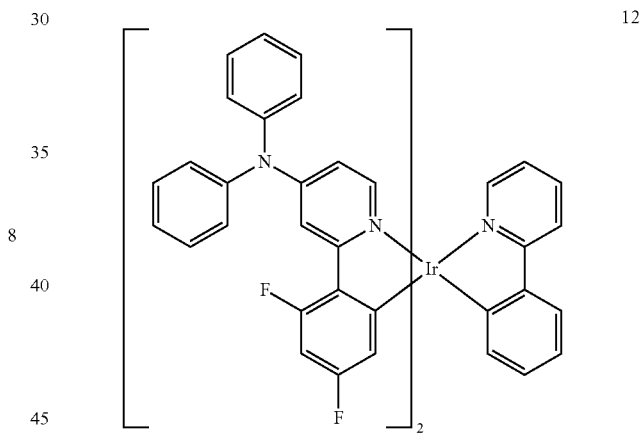
12
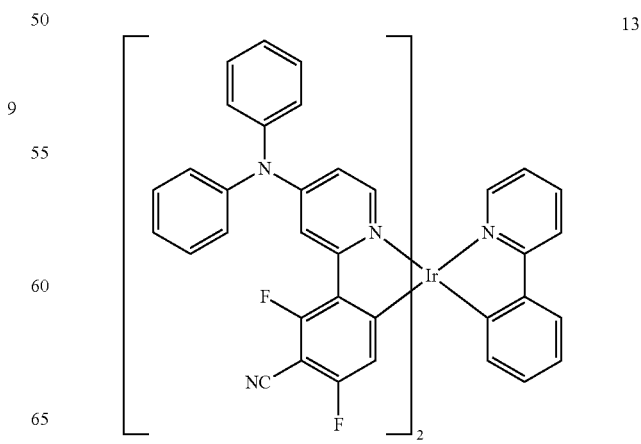
13

14
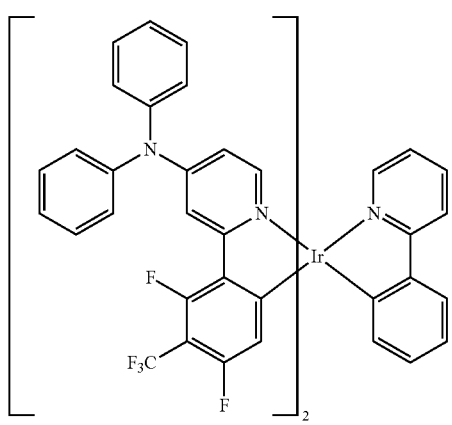
15
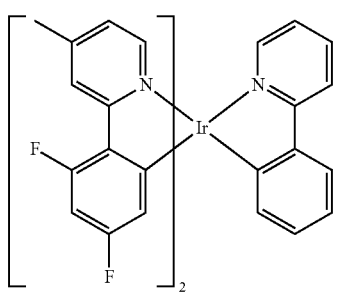
16
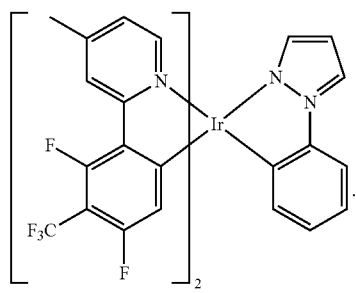
13. The organic light-emitting device as claimed in claim 11, wherein the carbazole-based compound represented by Formula 2A includes one of Compounds 21 to 42:
21
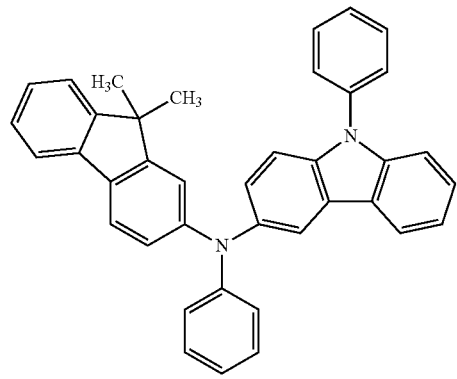
22
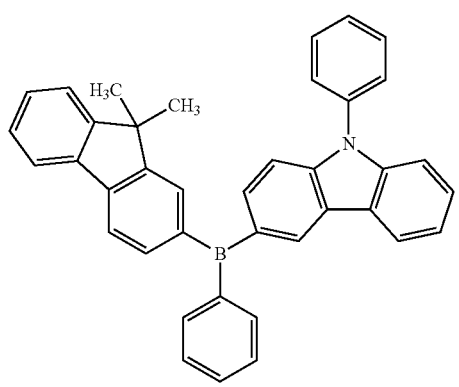
23
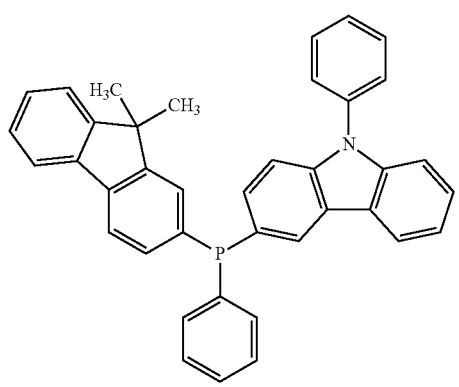
24
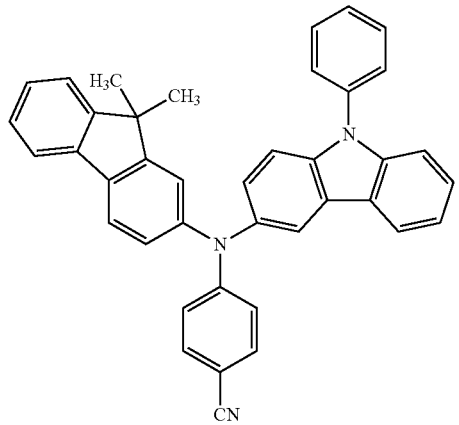

91
-continued
25
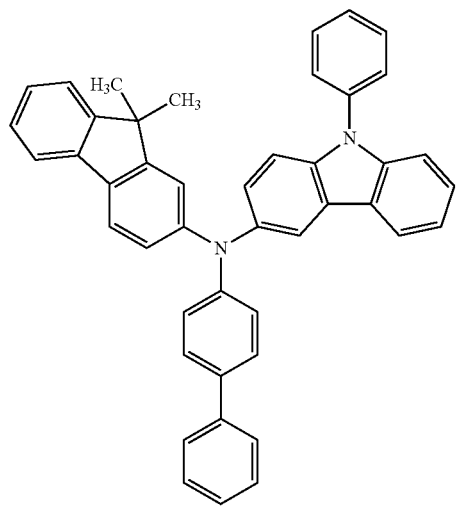
26
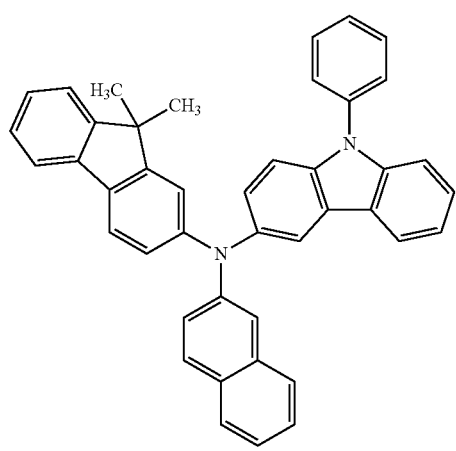
27
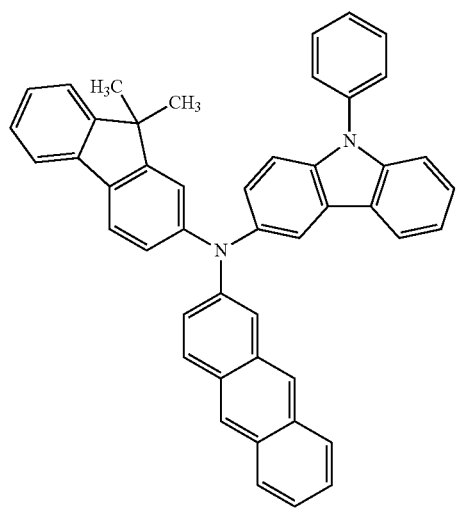
92
-continued
28
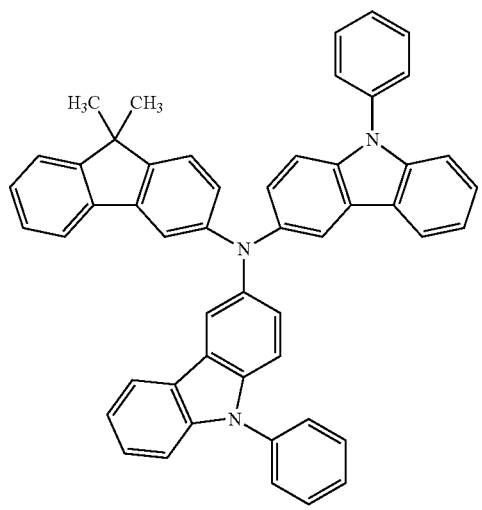
29
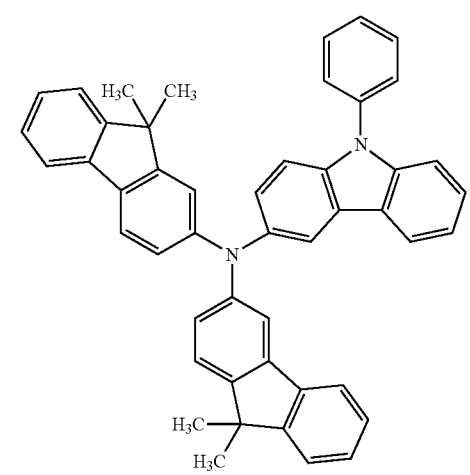
30
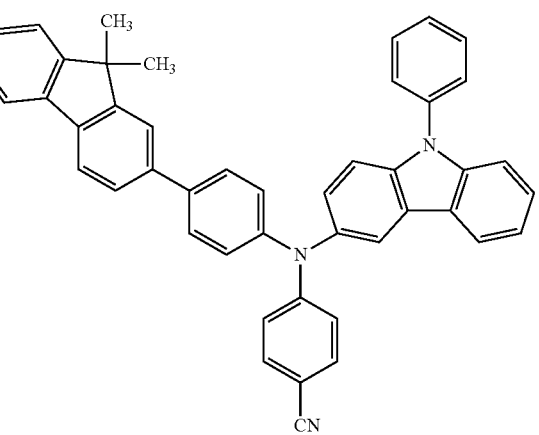

93
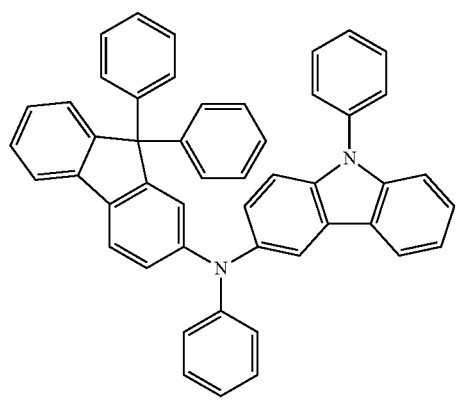
31
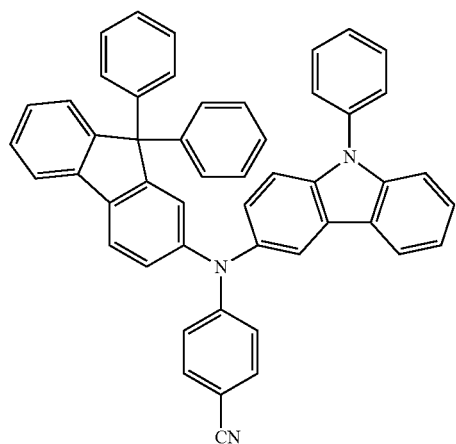
32
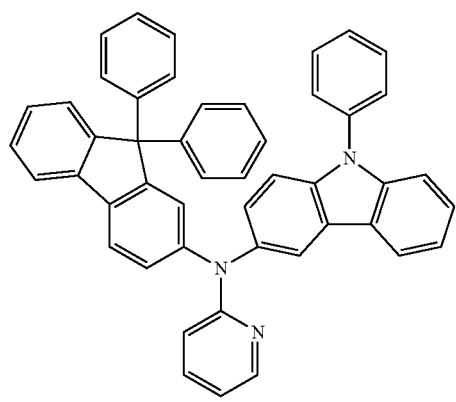
33
94
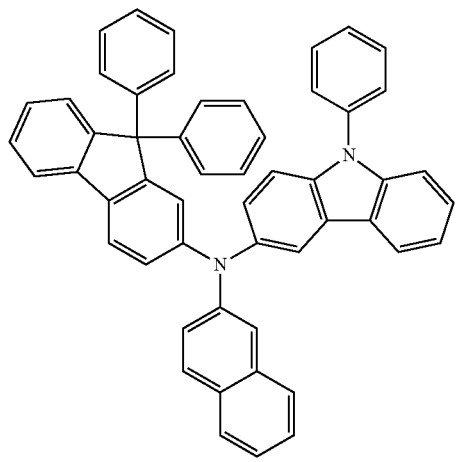
34
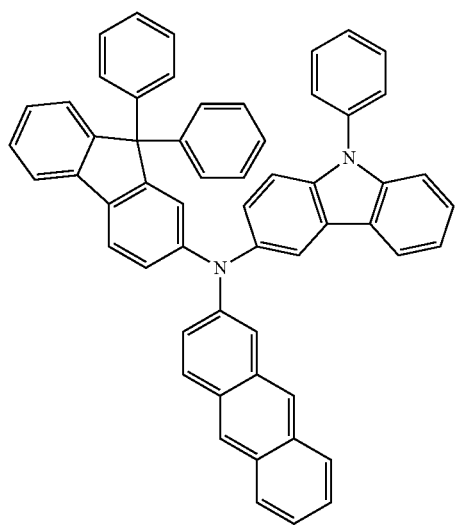
35
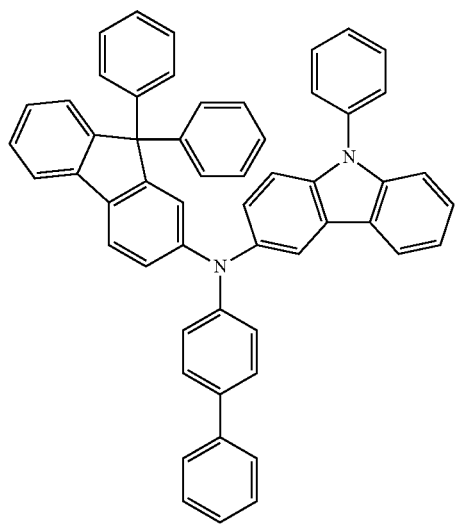
36

37
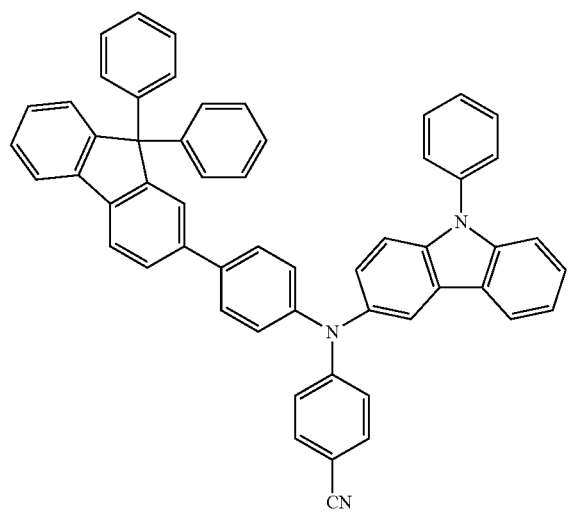
38
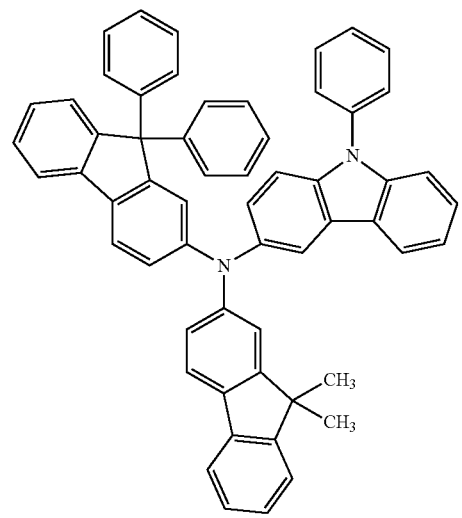
39
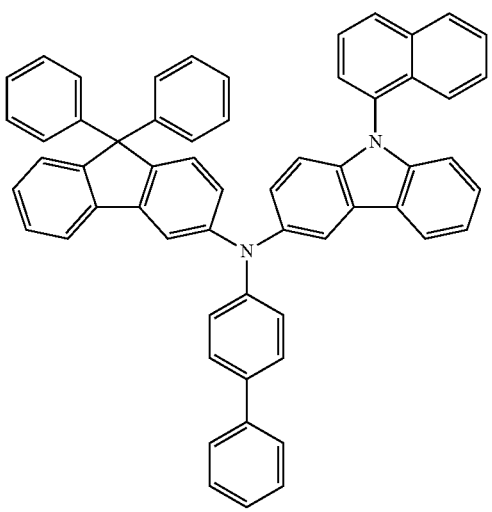
40
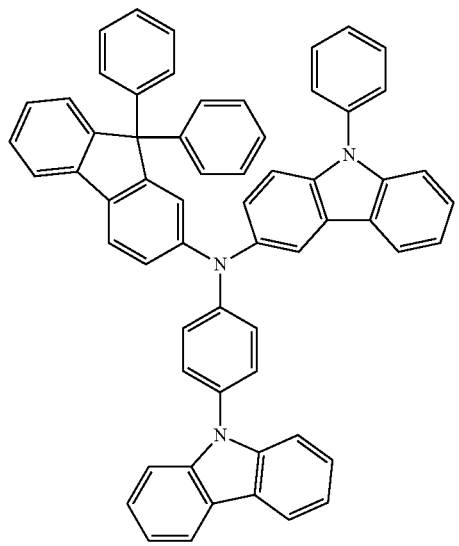
41

-continued
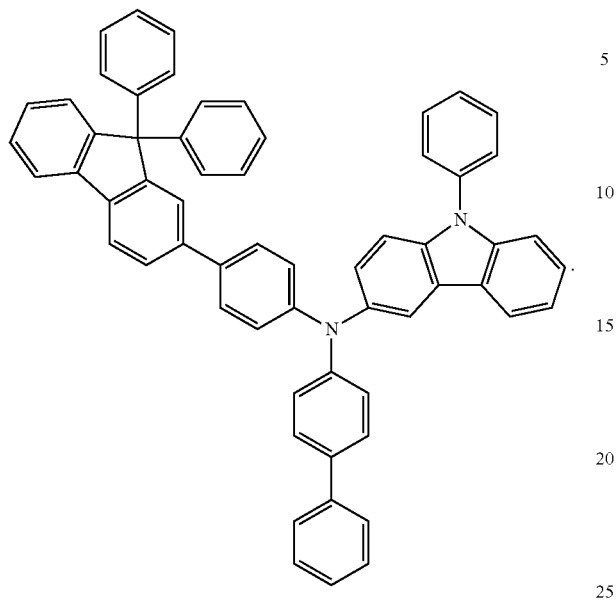
42
14. The organic light-emitting device as claimed in claim 11, wherein, in Formula 2A, X is a nitrogen atom.
* * * * *